(12) United States Patent
Nishimura et al.

(10) Patent No.: US 8,461,574 B2
(45) Date of Patent: Jun. 11, 2013

(54) ORGANIC ELECTROLUMINESCENCE DEVICE

(75) Inventors: Kazuki Nishimura, Sodegaura (JP); Yuichiro Kawamura, Sodegaura (JP); Toshinari Ogiwara, Sodegaura (JP); Hitoshi Kuma, Sodegaura (JP); Kenichi Fukuoka, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 355 days.

(21) Appl. No.: 12/816,030

(22) Filed: Jun. 15, 2010

(65) Prior Publication Data

US 2011/0049483 A1 Mar. 3, 2011

Related U.S. Application Data

(63) Continuation-in-part of application No. 12/486,894, filed on Jun. 18, 2009, now abandoned.

(30) Foreign Application Priority Data

Jun. 12, 2009 (JP) ................................. 2009-141347

(51) Int. Cl.
*H01L 35/24* (2006.01)

(52) U.S. Cl.
USPC ................................... 257/40; 257/E51.022

(58) Field of Classification Search
USPC ................. 257/40, 98, 14, 13, 15, 26, 79, 88, 257/89, 87, 90, E51.022, E51.01, E51.05
See application file for complete search history.

(56) References Cited

U.S. PATENT DOCUMENTS

| 7,723,735 B2 * | 5/2010 | Matsuda .......................... 257/88 |
| 2009/0009065 A1 | 1/2009 | Nishimura et al. |

(Continued)

FOREIGN PATENT DOCUMENTS

| JP | 2005-158676 A | 6/2005 |
| JP | 2007-234241 | 9/2007 |

(Continued)

OTHER PUBLICATIONS

U.S. Appl. No. 13/388,389, filed Feb. 1, 2012, Kawamura, et al.

(Continued)

*Primary Examiner* — Hoa B Trinh
(74) *Attorney, Agent, or Firm* — Oblon, Spivak, McClelland, Maier & Neustadt, L.L.P.

(57) ABSTRACT

An organic electroluminescence device including opposite anode and cathode, and a hole-transporting region, an emitting layer and an electron-transporting region in sequential order from the anode between the anode and the cathode, wherein the emitting layer includes a red emitting portion, a green emitting portion, and a blue emitting portion; the blue emitting portion includes a host BH and a fluorescent dopant FBD; the triplet energy $E^T_{fbd}$ of the fluorescent dopant FBD is larger than the triplet energy $E^T_{bh}$ of the host BH; the green emitting portion includes a host GH and a phosphorescent dopant PGD; the electron-transporting region includes a common electron-transporting layer adjacent to the red emitting portion, the green emitting portion and the blue emitting portion; the common electron-transporting layer includes a material having a triplet energy $E^T_{el}$ larger than $E^T_{bh}$; and the difference between the affinity of the host GH and the affinity of the material constituting the common electron-transporting layer is 0.4 eV or less.

11 Claims, 3 Drawing Sheets

U.S. PATENT DOCUMENTS

| | | |
|---|---|---|
| 2009/0009066 A1 | 1/2009 | Nishimura et al. |
| 2009/0009067 A1 | 1/2009 | Nishimura et al. |
| 2009/0045730 A1 | 2/2009 | Nishimura et al. |
| 2009/0045731 A1 | 2/2009 | Nishimura et al. |
| 2009/0174313 A1 | 7/2009 | Nishimura et al. |
| 2010/0219400 A1 | 9/2010 | Arakane et al. |

FOREIGN PATENT DOCUMENTS

| | | |
|---|---|---|
| JP | 2008-294200 | 12/2008 |
| KR | 2006-0135597 A | 12/2006 |
| KR | 2009-0093894 A | 9/2009 |
| WO | 2008/015949 A1 | 2/2008 |
| WO | 2009/008344 A1 | 1/2009 |
| WO | 2009-008346 A1 | 1/2009 |

OTHER PUBLICATIONS

U.S. Appl. No. 13/302,205, filed Nov. 22, 2011, Kawamura, et al.
U.S. Appl. No. 13/302,063, filed Nov. 22, 2011, Kawamura, et al.
International Search Report issued Sep. 21, 2010 in PCT/JP2010/003869 filed Jun. 10, 2010.
U.S. Appl. No. 13/388,576, filed Feb. 2, 2012, Ogiwara, et al.
U.S. Appl. No. 13/386,826, filed Jan. 24, 2012, Nishimura, et al.
Search Report issued in Korean Patent Application No. 10-2011-7029524, filed Dec. 9, 2011.

* cited by examiner

ORGANIC ELECTROLUMINESCENCE DEVICE

TECHNICAL FIELD

The invention relates to an organic electroluminescence (EL) device. More particularly, the invention relates to a highly efficient organic EL device.

BACKGROUND ART

An organic EL device can be classified into two types, i.e. a fluorescent EL device and a phosphorescent EL device according to its emission principle. When a voltage is applied to an organic EL device, holes are injected from an anode, and electrons are injected from a cathode, and holes and electrons recombine in an emitting layer to form excitons. As for the resulting excitons, according to the electron spin statistics theory, they become singlet excitons and triplet excitons in an amount ratio of 25%:75%. Therefore, in a fluorescent EL device which uses emission caused by singlet excitons, the limited value of the internal quantum efficiency is believed to be 25%. A technology for prolonging the lifetime of a fluorescent EL device utilizing a fluorescent material has been recently improved. This technology is being applied to a full-color display of portable phones, TVs, or the like. However, a fluorescent EL device is required to be improved in efficiency.

In association with the technology of improving the efficiency of a fluorescent EL device, several technologies are disclosed in which emission is obtained from triplet excitons, which have heretofore been not utilized effectively. For example, in Non-Patent Document 1, a non-doped device in which an anthracene-based compound is used as a host material is analyzed. A mechanism is found that singlet excitons are formed by collision and fusion of two triplet excitons, whereby fluorescent emission is increased. However, Non-Patent Document 1 discloses only that fluorescent emission is increased by collision and fusion of triplet excitons in a non-doped device in which only a host material is used. In this technology, an increase in efficiency by triplet excitons is as low as 3 to 6%.

Non-Patent Document 2 reports that a blue fluorescent device exhibits an internal quantum efficiency of 28.5%, exceeding 25%, which is the conventional theoretical limit value. However, no technical means for attaining an efficiency exceeding 25% is disclosed. In respect of putting a full-color organic EL TV into practical use, a further increase in efficiency has been required.

In Patent Document 1, another example is disclosed in which triplet excitons are used in a fluorescent device. In normal organic molecules, the lowest excited triplet state (T1) is lower than the lowest excited singlet state (S1). However, in some organic molecules, the triplet excited state (T2) is higher than S1. In such a case, it is believed that emission from the singlet excited state can be obtained due to the occurrence of transition from T2 to S1. However, actually, the external quantum efficiency is about 6% (the internal quantum efficiency is 24% when the outcoupling efficiency is taken as 25%), which does not exceed the value of 25% which has conventionally been believed to be the limit value. The mechanism disclosed in this document is that emission is obtained due to the intersystem crossing from the triplet excited state to the singlet excited state in a single molecule. Generation of single excitons by collision of two triplet excitons as disclosed in Non-Patent Document 1 is not occurred in this mechanism.

Patent Documents 2 and 3 each disclose a technology in which a phenanthroline derivative such as BCP (bathocuproin) and BPhen is used in a hole-blocking layer in a fluorescent device to increase the density of holes at the interface between a hole-blocking layer and an emitting layer, enabling recombination to occur efficiently. However, a phenanthroline derivative such as BCP (bathocuproin) and BPhen is vulnerable to holes and poor in resistance to oxidation, and the performance thereof is insufficient in respect of prolonging the lifetime of a device.

In Patent Documents 4 and 5, a fluorescent device is disclosed in which an aromatic compound such as an anthracene derivative is used as a material for an electron-transporting layer which is in contact with an emitting layer. However, this is a device which is designed based on the mechanism that generated singlet excitons emit fluorescence within a short period of time. Therefore, no consideration is made on the relationship with the triplet energy of an electron-transporting layer which is normally designed in a phosphorescent device. Actually, since the triplet energy of an electron-transporting layer is smaller than the triplet energy of an emitting layer, triplet excitons generated in an emitting layer are diffused to an electron-transporting layer, and then, thermally deactivated. Therefore, it is difficult to exceed the theoretical limit value of 25% of the conventional fluorescent device. Furthermore, since the affinity of an electron-transporting layer is too large, electrons are not injected satisfactorily to an emitting layer of which the affinity is small, and hence, improvement in efficiency cannot necessarily be attained. In addition, Patent Document 6 discloses a device in which a blue-emitting fluoranthene-based dopant which has a long life and a high efficiency. This device is not necessarily highly efficient.

Meanwhile, a phosphorescent device directly utilizes emission from triplet excitons. Since the singlet exciton energy is converted to triplet excitons by the spin conversion within an emitting molecule, it is expected that an internal quantum efficiency of nearly 100% can be attained, in principle. For the above-mentioned reason, since a phosphorescent device using an Ir complex was reported by Forrest et al. in 2000, a phosphorescent device has attracted attention as a technology of improving efficiency of an organic EL device. Although a red phosphorescent device has reached the level of practical use, green and blue phosphorescent devices have a lifetime shorter than that of a fluorescent device. In particular, as for a blue phosphorescent device, there still remains a problem that not only lifetime is short but also color purity or luminous efficiency is insufficient. For these reasons, phosphorescent devices have not yet been put into practical use.

As a method for obtaining a full-color organic EL device, an emitting layer is patterned to provide a blue-emitting fluorescent layer, a green-emitting phosphorescent layer and a red-emitting phosphorescent layer. If peripheral layers other than an emitting layer are used as the common layer for the three emitting layers, the production steps are reduced, thereby to facilitate mass production. However, the blue-emitting fluorescent layer, the green-emitting phosphorescent layer and the red-emitting phosphorescent layer largely differ in physical value of constituent materials, for example, affinity, ionization potential, energy gap or the like. When peripheral layers are used as the common layer, a configuration is made in which optimum carrier injection performance can be attained in the green-emitting phosphorescent layer of which the energy gap is the largest. Therefore, other emitting layers (in particular, blue-emitting fluorescent layer) have deteriorated performance.

Patent Document 9 discloses a device comprising a blue emitting portion containing a fluorescent dopant, a green emitting portion containing a phosphorescent dopant and a red emitting portion containing a phosphorescent dopant, in which a hole-blocking layer is provided as the common layer.

In this device, by using a hole-blocking layer as the common layer, the production steps are reduced. However, use of a hole-blocking layer as the common layer, electron injection from the hole-blocking layer to each emitting layer has become a problem to be solved. Actually, difference in affinity level between a blue emitting portion and a hole-blocking layer is as small as about 0.2 eV. Since a material having a small affinity such as CBP is used in a green emitting portion, difference in affinity between the green emitting portion and the hole-blocking layer is as large as about 0.6 eV. Therefore, electron-injection properties are lowered in the green emitting portion, whereby a driving voltage is increased. Furthermore, since a recombination region is concentrated in the interface between a green phosphorescent emitting layer and a hole-blocking layer, excitons are significantly diffused, thereby inhibiting improvement in luminous efficiency of a green emitting portion.

Patent Document 10 discloses an organic EL device in which difference in affinity $\Delta Af$ between an emitting layer containing a phosphorescent-emitting dopant and an electron-transporting layer satisfies the relationship $0.2 < \Delta Af \leq 0.65$ eV. However, in this technology, no disclosure is made on improvement in efficiency of the emitting layer when patterning of a blue emitting portion, a green emitting portion and a red emitting portion is performed.

RELATED ART DOCUMENTS

Patent Documents

Patent Document 1: JP-A-2004-214180
Patent Document 2: JP-A-H10-79297
Patent Document 3: JP-A-2002-100478
Patent Document 4: JP-A-2003-338377
Patent Document 5: WO2008/062773
Patent Document 6: WO2007/100010
Patent Document 7: JP-T-2002-525808
Patent Document 8: U.S. Pat. No. 7,018,723
Patent Document 9: JP-A-2005-158676
Patent Document 10: WO2005/076668

Non-Patent Documents

Non-Patent Document 1: Journal of Applied Physics, 102, 114504 (2007)
Non-Patent Document 2: SID 2008 DIGEST, 709 (2008)

SUMMARY OF THE INVENTION

In view of the above-mentioned circumstances, the inventors noticed a phenomenon stated in Non-Patent Document 1, i.e. a phenomenon in which singlet excitons are generated by collision and fusion of two triplet excitons (hereinafter referred to as Triplet-Triplet Fusion=TTF phenomenon), and made studies in an attempt to improve efficiency of a fluorescent device by allowing the TTF phenomenon to occur efficiently. Specifically, the inventors made studies on various combinations of a host material (hereinafter often referred to simply as a "host") and a fluorescent dopant material (hereinafter often referred to simply as a "dopant"). As a result of the studies, the inventors have found that when the triplet energy of a host and that of a dopant satisfies a specific relationship, and a material having large triplet energy is used in a layer which is adjacent to the interface on the cathode side of an emitting layer, triplet excitons are confined within the emitting layer to allow the TTF phenomenon to occur efficiently, whereby improvement in efficiency and lifetime of a fluorescent device can be realized.

In addition, the inventors noticed the relationship between the affinity of the host of each of the blue-emitting fluorescent layer, the green-emitting phosphorescent layer and the red-emitting phosphorescent layer in a full-color device to improve the electron-injection properties thereof, and also found the relationship of a material constituting an electron-transporting layer which is provided as a common layer for the blue-emitting fluorescent layer, the green-emitting phosphorescent layer and the red-emitting phosphorescent layer, whereby improvement in efficiency of a full-color device has been realized.

It is known that, in a phosphorescent device, a high efficiency can be attained by using a material having large triplet energy in a layer which is adjacent to the interface on the cathode side of an emitting layer in order to prevent diffusion of triplet excitons outside the emitting layer, of which the exciton lifetime is longer than that of singlet excitons. JP-T-2002-525808 discloses a technology in which a blocking layer formed of BCP (bathocuproin), which is a phenanthroline derivative, is provided in such a manner that it is adjacent to an emitting layer, whereby holes or excitons are confined to achieve a high efficiency. U.S. Pat. No. 7,018,723 discloses use of a specific aromatic ring compound in a hole-blocking layer in an attempt to improve efficiency and prolonging lifetime. However, in these documents, for a phosphorescent device, the above-mentioned TTF phenomenon is called TTA (Triplet-Triplet Annihilation: triplet pair annihilation). That is, the TTA phenomenon is known as a phenomenon which deteriorates emission from triplet excitons which is the characteristics of phosphorescence. In a phosphorescent device, efficient confinement of triplet excitons within an emitting layer does not necessarily result in improvement in efficiency.

The object of the invention is to improve efficiency and lifetime without increasing the production cost in an organic EL device having a blue emitting portion, a green emitting portion and a red emitting portion.

The invention provides the following organic electroluminescence device.
1. An organic electroluminescence device comprising opposite anode and cathode, and a hole-transporting region, an emitting layer and an electron-transporting region in sequential order from the anode between the anode and the cathode,
wherein the emitting layer comprises a red emitting portion, a green emitting portion, and a blue emitting portion;
the blue emitting portion comprises a host BH and a fluorescent dopant FBD;
the triplet energy $E^T_{fbd}$ of the fluorescent dopant FBD is larger than the triplet energy $E^T_{bh}$ of the host BH;
the green emitting portion comprises a host GH and a phosphorescent dopant PGD;
the electron-transporting region comprises a common electron-transporting layer adjacent to the red emitting portion, the green emitting portion and the blue emitting portion;
the common electron-transporting layer comprises a material having a triplet energy $E^T_{el}$ larger than $E^T_{bh}$; and
the difference between the affinity of the host GH and the affinity of the material constituting the common electron-transporting layer is 0.4 eV or less.
2. The organic electroluminescence device according to 1, wherein the red emitting portion contains a host RH and a phosphorescent dopant PRD; and the difference between the affinity of the host RH and the affinity of the material constituting the electron-transporting layer is 0.4 eV or less.

3. The organic electroluminescence device according to 1 or 2, wherein the difference between the affinity of the host BH and the affinity of the material constituting the electron-transporting layer is 0.4 eV or less.

4. The organic electroluminescence device according to any one of 1 to 3, wherein the electron mobility of the material constituting the electron-transporting layer is $10^{-6}$ cm$^2$/Vs or more in an electric field intensity of 0.04 to 0.5 MV/cm.

5. The organic electroluminescence device according to any one of 1 to 4, wherein an electron-injecting layer is provided between the electron-transporting layer and the cathode in the electron-transporting region.

6. The organic electroluminescence device according to any one of 1 to 5, wherein the affinity $Af_{gh}$ of the host GH is 2.6 eV or more.

7. The organic electroluminescence device according to any one of 1 to 6, wherein the ionization potential $Ip_{gd}$ of the dopant GD is 5.2 eV or more.

8. The organic electroluminescence device according to any one of 1 to 7, wherein at least one of the blue emitting portion, the green emitting portion and the red emitting portion contains a second dopant.

9. The organic electroluminescence device according to 8, wherein the green emitting portion contains a second dopant GD2.

10. The organic electroluminescence device according to 9, wherein the different between the affinity $Af_{gd2}$ of the second dopant GD2 and the affinity $Af_{gh}$ of the host GH is 0.4 eV or less.

11. The organic electroluminescence device according to any one of 1 to 10, wherein the host BH is a compound which does not contain a double bond in other parts than a ring structure.

According to the invention, in an organic EL device having a blue emitting portion, a green emitting portion and a red emitting portion, it is possible to improve efficiency and lifetime without increasing production cost.

MODE FOR CARRYING OUT THE INVENTION

The configuration of the organic EL device of the invention will be explained with reference to the drawings.

Figure 1:
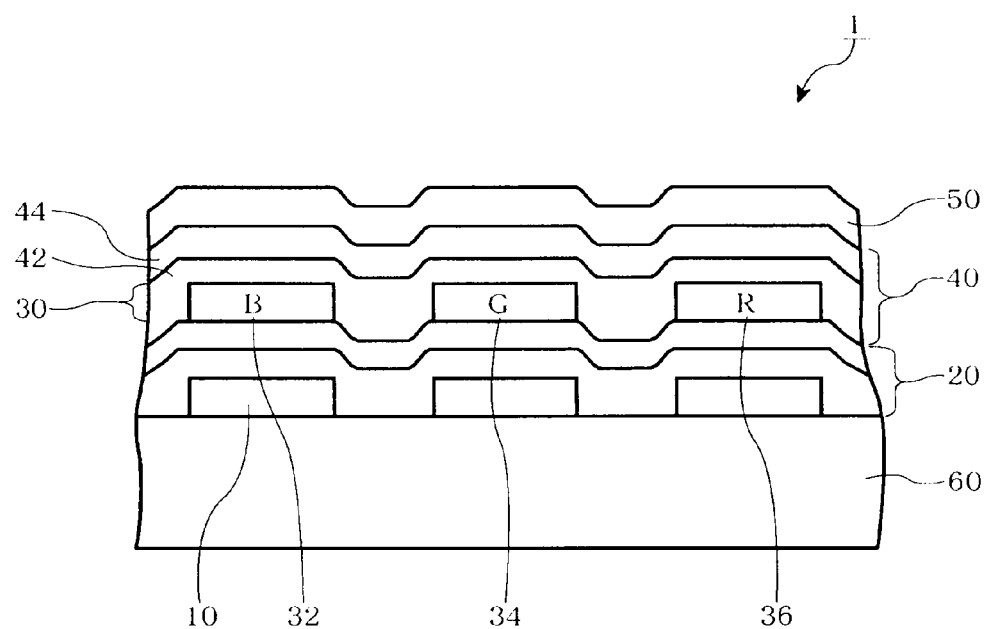
FIG. 1 is a view showing an organic EL device according to one embodiment of the invention.

FIG. 1 is a view showing an organic EL device according to one embodiment of the invention.

An organic EL device 1 comprises, between an anode 10 and a cathode 50 which are opposite on a substrate 60, a hole-transporting region 20, an emitting layer 30 and an electron-transporting region 40 in a sequential order from the anode 10.

The emitting layer 30 is formed of a blue emitting portion 32, a green emitting portion 34 and a red emitting portion 36. The emitting layer 30 is provided such that the red emitting portion 36, the green emitting portion 34 and the blue emitting portion 32 are put side by side in a direction perpendicular to the substrate surface. The blue emitting portion 32 contains a host BH and a fluorescent dopant FBD, the green emitting portion 34 contains a host GH and a phosphorescent dopant PGD, and preferably, the red emitting portion 36 contains a host RH and a phosphorescent dopant PRD.

Further, within the electron-transporting region 40, a common electron-transporting layer 42 is provided in such a manner that it is adjacent to the blue emitting portion 32, the green emitting portion 34 and the red emitting portion 36. Preferably, within the electron-transporting region 40, an electron-injecting layer 44 is provided between the electron-transporting layer 42 and the cathode 50, more preferably the electron-injection layer 44 is provided such that it is adjacent to the electron-transporting layer 42.

In the hole-transporting region 20, a hole-transporting layer, or both a hole-transporting layer and a hole-injecting layer may be provided.

The method for fabricating the organic EL device 1 is explained hereinbelow. The anode 10 is stacked on the substrate 60, followed by patterning. As the material for the anode 10, a metal film as a reflective film is used in the case of a front-emission type device. An indium tin oxide (ITO), indium zinc oxide or the like is used as a transparent electrode in the case of a back emission-type device. Thereafter, as the hole-transporting region 20, the hole-injecting layer is stacked over the entire surface of the substrate, and the hole-transporting layer is stacked thereon.

The emitting portions are formed such that each emitting portion corresponds to the position of the anode. When the vacuum vapor deposition method is used, the blue emitting portion 32, the green emitting portion 34 and the red emitting portion 36 are finely patterned by means of a shadow mask.

Subsequently, the electron-transporting region 40 is stacked over the entire surface of the blue emitting portion 32, the green emitting portion 34 and the red emitting portion 36.

Then, the cathode is stacked, whereby an organic EL device is fabricated.

As the substrate, a glass substrate, a TFT substrate or the like may be used.

In this embodiment, the hole-transporting region 20 is commonly provided as the hole-injecting layer and the hole-transporting layer using a common material. It is also possible to provide the hole-transporting region 20 by subjecting different materials to patterning in correspondence with the blue emitting portion 32, the green emitting portion 34 and the red emitting portion 36. As the hole-transporting region, a single hole-transporting layer may be used. Two or more layers formed of a combination of the hole-injecting layer and the hole-transporting layer may be stacked. When the hole-transporting region is formed of a plurality of layers, part of the layers are provided as a common layer, and the remaining layers may be provided in correspondence with the blue emitting portion 32, the green emitting portion 34 and the red emitting portion 36 by finely patterning different materials.

The emitting layer of the invention contains a blue pixel, a green pixel and a red pixel. The blue pixel, the green pixel and the red pixel are formed of the blue emitting portion, the green emitting portion and the red emitting portion, respectively. A voltage is separately applied to each pixel. Therefore, in the organic EL device 1 in FIG. 1, the blue emitting portion 32, the green emitting portion 34 and the red emitting portion 36 do not always emit light simultaneously, and it is possible to allow three emitting portions 32, 34 and 36 to emit light selectively. Although the organic EL device of the embodiment contains one blue pixel, one green pixel and one red pixel, a unit composed of one blue pixel, one green pixel and one red pixel may be arranged repeatedly in an organic EL device. Furthermore, a plurality of pixels of each color may be contained in an organic EL device. For example, a unit composed of one blue pixel, two green pixels and one red pixel may be arranged repeatedly.

The organic EL device of the invention is a device in which, in the above-mentioned blue emitting portion 32, the phenomenon stated in Non-Patent Document 1, i.e. singlet excitons are formed by collision and fusion of two triplet excitons (hereinafter referred to as the "Triplet-Triplet-Fusion (TTF) phenomenon"). First, an explanation is given below on the TTF phenomenon.

Holes and electrons injected from an anode and a cathode are recombined in an emitting layer to generate excitons. As for the spin state, as is conventionally known, singlet excitons account for 25% and triplet excitons account for 75%. In a conventionally known fluorescent device, light is emitted when singlet excitons of 25% are relaxed to the ground state. The remaining triplet excitons of 75% are returned to the ground state without emitting light through a thermal deactivation process. Accordingly, the theoretical limit value of the internal quantum efficiency of a conventional fluorescent device is believed to be 25%.

The behavior of triplet excitons generated within an organic substance has been theoretically examined. According to S. M. Bachilo et al. (J. Phys. Chem. A, 104, 7711 (2000)), assuming that high-order excitons such as quintet excitons are quickly returned to triplet excitons, triplet excitons (hereinafter abbreviated as $^3A^*$) collide with each other with an increase in the density thereof, whereby a reaction shown by the following formula occurs. In the formula, $^1A$ represents the ground state and $^1A^*$ represents the lowest excited singlet excitons.

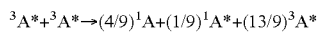

$$^3A^* + {}^3A^* \rightarrow (4/9)^1A + (1/9)^1A^* + (13/9)^3A^*$$

That is, $5\,^3A^* \rightarrow 4\,^1A + {}^1A^*$, and it is expected that, among triplet excitons initially generated, which account for 75%, one fifth thereof, that is, 20%, is changed to singlet excitons. Therefore, the amount of singlet excitons which contribute to emission is 40%, which is a value obtained by adding 15% ((75%×(1/5)=15%) to 25%, which is the amount ratio of initially generated singlet excitons. At this time, the ratio of luminous intensity derived from TTF (TTF ratio) relative to the total luminous intensity is 15/40, that is, 37.5%. Assuming that singlet excitons are generated by collision of initially-generated triplet excitons which account for 75% (that is, one siglet exciton is generated from two triplet excitons), a significantly high internal quantum efficiency of 62.5% is obtained which is a value obtained by adding 37.5% ((75%× (1/2)=37.5%) to 25%, which is the amount ratio of initially generated singlet excitons. At this time, the TTF ratio is 60% (37.5/62.5).

Figure 2:
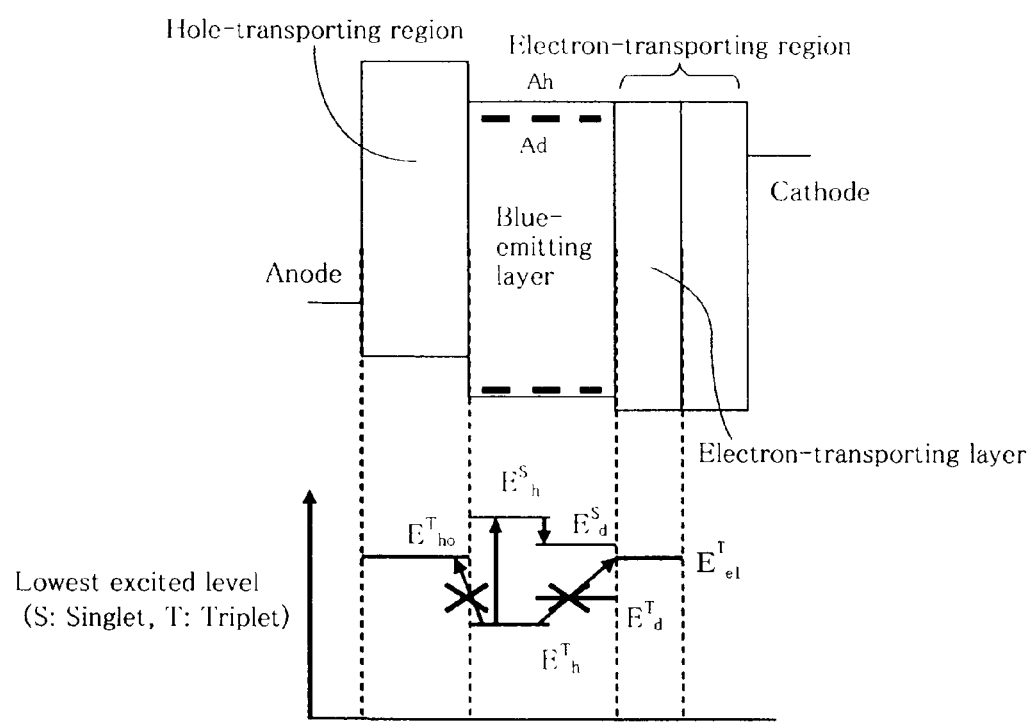
FIG. 2 is a view showing the energy state of the blue emitting portion according to one embodiment of the invention.
Figure 3:
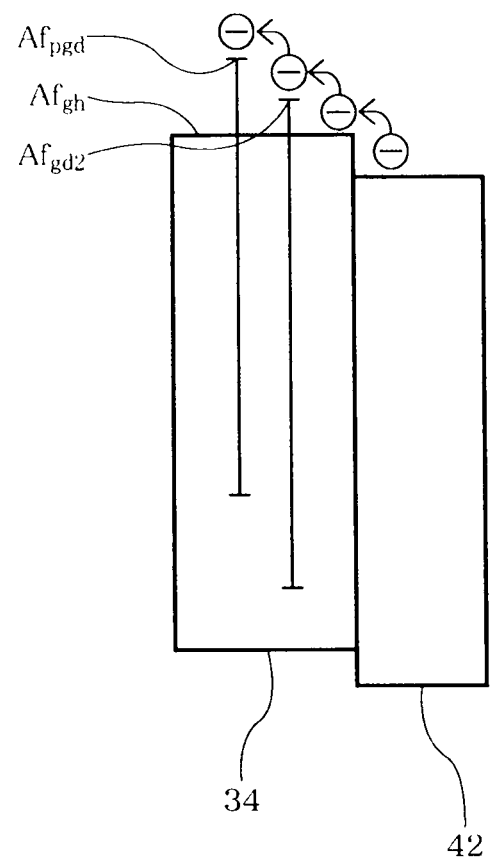
FIG. 3 is a view showing the energy state of the green emitting portion according to one embodiment of the invention.

FIG. 2 is a schematic view showing one example of the energy level of the blue emitting portion of the organic EL device shown in FIG. 1.

The upper view in FIG. 2 shows the device configuration and the HOMO and LUMO energy levels of each layer (here, the LUMO energy level and the HOMO energy level may be called as an affinity (Af) and an ionization potential (Ip), respectively). The lower view is a schematic view showing the lowest excited singlet energy level and the lowest excited triplet energy level of each layer. In the invention, the triplet energy is referred to as a difference between energy in the lowest triplet exited state and energy in the ground state. The singlet energy (often referred to as an energy gap) is referred to as a difference between energy in the lowest singlet excited state and energy in the ground state.

Holes injected from an anode are then injected to an emitting layer through a hole-transporting region. Electrons injected from a cathode are then injected to the emitting layer through an electron-transporting region. Thereafter, holes and electrons are recombined in the emitting layer, whereby singlet excitons and triplet excitons are generated. There are two manners as for the occurrence of recombination. Specifically, recombination may occur either on host molecules or on dopant molecules. As shown in the lower view of FIG. 2, if the triplet energy of a host and that of a dopant of the blue emitting portion are taken as $E^T_h$ and $E^T_d$, respectively, the relationship $E^T_h < E^T_d$ is satisfied. When this relationship is satisfied, triplet excitons generated by recombination on a host do not transfer to a dopant which has a higher triplet energy. Triplet excitons generated by recombination on dopant molecules quickly energy-transfer to host molecules. That is, triplet excitons on a host do not transfer to a dopant and collide with each other efficiently on the host to generate singlet exitons by the TTF phenomenon. Further, since the singlet energy $E^s_d$ of a dopant is smaller than the singlet energy $E^s_h$ of a host, singlet excitons generated by the TTF phenomenon energy-transfer from a host to a dopant, thereby contributing fluorescent emission of a dopant. In dopants which are usually used in a fluorescent device, transition from the excited triplet state to the ground state should be inhibited. In such a transition, triplet excitons are not optically energy-deactivated, but are thermally energy-deactivated. By causing the triplet energy of a host and the triplet energy of a dopant to satisfy the above-mentioned relationship, singlet excitons are generated efficiently due to the collision of triplet excitons before they are thermally deactivated, whereby luminous efficiency is improved.

In the invention, the electron-transporting layer has a function of preventing triplet excitons generated in the blue emitting portion to be diffused to the electron-transporting region, allowing triplet excitons to be confined within the blue emitting portion to increase the density of triplet excitons therein, causing the TTF phenomenon to occur efficiently. In order to suppress triplet excitons from being diffused, it is preferred that the triplet energy of the electron-transporting layer $E^T_{el}$ be larger than $E^T_h$. It is further preferred that $E^T_{el}$ be larger than $E^T_d$. Since the electron-transporting layer prevents triplet excitons from being diffused to the electron-transporting region, in the blue emitting portion, triplet excitons of a host become singlet excitons efficiently, and the singlet excitons transfer to a dopant, and are optically energy-deactivated.

Further, as shown in FIG. 2, in the hole-transporting region, the hole-transporting layer is adjacent to the blue emitting portion and the triplet energy of the hole-transporting layer $E^T_{ho}$ is larger than the $E^T_h$ of the host of the blue emitting portion, the triplet excitons generated in the blue emitting portion are kept within the blue emitting portion, and as a result, a higher luminous efficiency can be obtained.

Further, as shown in FIG. 2, if a host and a dopant are combined such that the relationship between the affinity Ah of the host and the affinity Ad of the dopant satisfies Ah≦Ad, the advantageous effects of the electron-transporting layer provided within the electron-transporting region are exhibited significantly, whereby improvement in efficiency due to the TTF phenomenon can be attained.

In the green emitting portion 34 of the organic EL device of the invention, the difference between the affinity of the host GH and the affinity of the material constituting the electron-transporting layer is 0.4 eV or less.

Normally, the triplet energy of the phosphorescent dopant PGD of the green emitting portion is larger than the triplet energy $E^T_{el}$ of the material constituting the electron-transporting layer. Therefore, it is preferable that the triplet energy $E^T_{el}$ of the material constituting the electron-transporting layer be larger than the triplet energy of the PGD. However, since a materials having a larger triplet energy has problems in electron injection from an electrode or hole resistance, such a material cannot be necessarily used in order to obtain an excellent phosphorescent device. In this case, prior to phosphorescent emission, the triplet excitons on the phosphorescent dopant PGD transfer to the material constituting the electron-transporting layer of which the triplet energy is smaller. As a result, luminous efficiency of the green emitting portion is lowered. Therefore, as in the case of the invention, when the difference between the affinity of the host GH and the affinity of the material constituting the electron-transporting layer is allowed to be 0.4 eV or less, the injection properties of electrons from the electron-transporting layer to the green emitting portion is improved. As a result, electrons and holes are recombined in the hole-transporting region side of the emitting layer in a biased manner, that is, electrons and holes are recombined at a distance from the electron-transporting region. As a result, triplet excitons are generated at a distance from the green emitting portion, triplet excitons hardly transfer from the green emitting portion to the electron-transporting layer, whereby lowering in luminous efficiency can be prevented.

In addition, in order to keep the recombination region away from the electron-transporting layer, the hole mobility $\mu h$ and the electron mobility $\mu e$ of the host of the emitting layer desirably satisfies the relationship $\mu e/\mu h>1$. $\mu e/\mu h>5$ is most desirable.

As mentioned above, in the invention, emitting portions of three colors are formed in parallel. However, mass productivity is improved since a common material is used as the electron-transporting layer. Further, in the blue emitting portion, the luminous efficiency thereof is improved by utilizing the TTF phenomenon. In the green emitting portion, the luminous efficiency thereof is prevented from lowering by adjusting the affinity. As a result, a high efficiency is attained in both the blue emitting portion and the green emitting portion.

The red emitting portion 36 can be formed such that it contains a host RH and a phosphorescent dopant PRD. If the red emitting portion 36 contains the host RH and the phosphorescent dopant PRD, it is preferred that the difference between the affinity of the host RH and the affinity of the material constituting the electron-transporting layer is 0.4 eV or less. The reason therefor is that, as mentioned above, luminous efficiency is prevented from lowering since the transfer of triplet energy from the red emitting portion to the electron-transporting layer becomes difficult.

Also, it is preferred that the difference between the affinity of the host BH of the blue emitting portion and the affinity of the material constituting the electron-transporting layer be 0.4 eV or less. The reason therefor is that electron injecting properties to the emitting portion are improved by allowing the difference in affinity to be 0.4 eV or less. When the electron injecting properties to the emitting portion are deteriorated, the density of triplet excitons is decreased since the electron-hole recombination in the emitting portion is decreased. If the density of triplet excitons is decreased, the frequency of collision of triplet excitons is reduced, and a TTF phenomenon does not occur efficiently. Further, since electron injection performance is improved, the organic EL device can be driven at a lower voltage.

In the green emitting portion, it is preferred that the host GH have an affinity $Af_{gh}$ of 2.6 eV or more in order to enhance electron flowability and allow the recombination region to be away from the electron-transporting region. The ionization potential $Ip_{gd}$ of the dopant GD of the green emitting portion is preferably 5.2 eV or more in order to improve the probability of recombination. If the affinity $Af_{gh}$ of the host is increased in order to improve electron-injecting properties, the difference between the affinity $Af_{gh}$ and the affinity $Af_{gd}$ of the dopant is increased, and injection of electrons to the dopant becomes difficult, and the probability of recombination on the dopant is lowered. For this reason, it is desirable to allow the affinity $Af_{gd}$ of the dopant to be large, or to allow the ionization potential $Ip_{gd}$ of the dopant to be large.

It is preferred that the green emitting portion contain, in addition to the dopant PGD, a second dopant GD2 having an affinity $Af_{gd2}$ of which the difference with the affinity $Af_{gh}$ of the host GH is 0.4 eV or less. Further, the energy gap of the dopant PGD is desirably smaller than the energy gap of the second dopant GD2.

In the green emitting portion, normally, electrons are transferred from the electron-transporting layer to the host GH in the green emitting portion, and then transferred from the host GH to the dopant PGD. If the difference between the affinity $Af_{gh}$ of the host GH and the affinity $Af_{gh}$ of the dopant is increased and injection properties of electrons to the dopant is lowered, part of electrons may be flown directly in the direction of the anode without transferring from the host GH to the dopant PGD. If the second dopant having an affinity $Af_{gd2}$ of which the difference with the affinity $Af_{gh}$ of the host GH is 0.4 eV or less is contained, electrons flow from the electron-transporting layer to the host GH of the green emitting portion, and then flow to the second dopant GD2 and the dopant PGD, whereby part of electrons can be prevented from flowing to the anode without transferring to the dopant PGD. As a result, a larger number of electrons reach the dopant PGD to improve recombination probability, whereby luminous efficiency can be improved.

The blue emitting portion or the red emitting portion may contain a second dopant having an affinity $Af_{gd2}$ of which the difference with the affinity $Af_{gh}$ of the host of the blue emitting portion or the red emitting portion is 0.4 eV or less. Due to the presence of the second dopant, electrons can be prevented from directly flowing in the anode direction without transferring to the dopant.

In the invention, the materials constituting the hosts and the dopants of the blue emitting portion, the green emitting portion and the red emitting portion and the material constituting the electron-transporting layer can be produced by selecting from known compounds a compound satisfying the above-mentioned conditions which are necessary or preferable for the invention. Although the materials constituting each layer are not limited as long as the conditions required for the invention are satisfied, preferably, they can be selected from the following compounds.

The host of the blue emitting portion is an anthracene derivative and a polycyclic aromatic skeleton-containing compound or the like. An anthracene derivative is preferable. The dopant of the blue emitting portion is a fluoranthene derivative, a pyrene derivative, an arylacetylene derivative, a fluoren derivative, a boron complex, a perylene derivative, an oxadiazole derivative and an anthracene derivative or the like. A fluoranthene derivative, a pyrene derivative and a boron complex are preferable, with fluoranthene derivatives and boron complex compounds being more preferable. As for the combination of a host and a dopant, it is preferred that the host be an anthracene derivative and the dopant be a fluoranthene derivative or a boron complex.

Specific examples of the fluoranthene derivatives are given below.

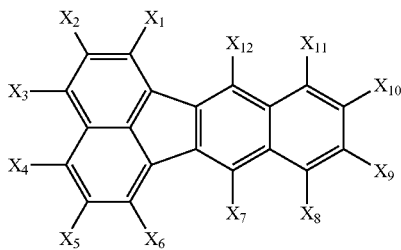

wherein $X_1$ to $X_{12}$ are hydrogen or a substituent. Preferably, it is a compound in which $X_1$ to $X_2$, $X_4$ to $X_6$ and $X_8$ to $X_{11}$ are a hydrogen atom and $X_3$, $X_7$ and $X_{12}$ are a substituted or unsubstituted aryl group having 5 to 50 atoms that form a ring (hereinafter referred to as ring atoms). More preferably, it is a compound in which $X_1$ to $X_2$, $X_4$ to $X_6$ and $X_8$ to $X_{11}$ are a hydrogen atom, $X_7$ and $X_{12}$ are a substituted or unsubstituted aryl group having 5 to 50 ring atoms, $X_3$ is —$Ar_1$—$Ar_2$ ($Ar_1$ is a substituted or unsubstituted arylene group having 5 to 50 ring atoms, and $Ar_2$ is a substituted or unsubstituted aryl group having 5 to 50 ring atoms). Further preferably, it is a compound in which $X_1$ to $X_2$, $X_4$ to $X_6$ and $X_8$ to $X_{11}$ are a hydrogen atom, $X_7$ and $X_{12}$ are a substituted or unsubstituted aryl group having 5 to 50 ring atoms and $X_3$ is —$Ar_1$—$Ar_2$—$Ar_3$ (wherein $Ar_1$ and $Ar_2$ are independently a substituted or unsubstituted arylene group having 5 to 50 ring atoms and $Ar_3$ is a substituted or unsubstituted aryl group having 5 to 50 ring atoms).

Specific examples of the boron complex compounds are given below.

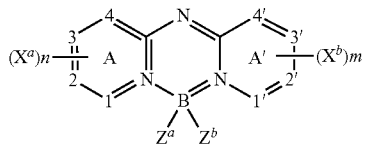

wherein A and A' are an independent azine ring system corresponding to a six-membered aromatic ring system containing at least one nitrogen; $X^a$ and $X^b$, which are independently a substituent, respectively may bond to the ring A or the ring A' to form a fused ring for the ring A or the ring A'; the fused ring contains an aryl or heteroaryl substituent; m and n are independently 0 to 4; $Z^a$ and $Z^b$ are independently a halide; and 1, 2, 3, 4, 1', 2', 3' and 4' are independently a carbon atom or a nitrogen atom.

Desirably, the azine ring is a quinolynyl or isoquinolynyl ring in which each of 1, 2, 3, 4, 1', 2', 3' and 4' is a carbon atom, m and n are 2 or more and $X^a$ and $X^b$ are a substituent having 2 or more carbon atoms which bonds to the azine ring to form an aromatic ring. It is preferred that $Z^a$ and $Z^b$ be a fluorine atom.

Specific examples of anthracene compounds include the following compounds:

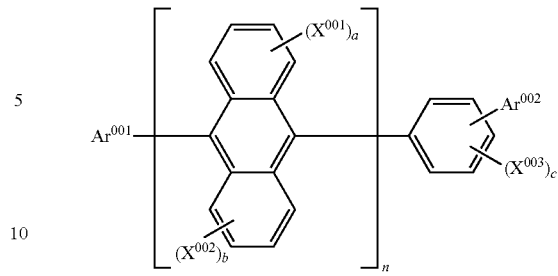

wherein $Ar^{001}$ is a substituted or unsubstituted fused aromatic group having 10 to 50 carbon atoms that form a ring (hereinafter referred to as ring carbon atoms); $Ar^{002}$ is a substituted or unsubstituted aromatic group having 6 to 50 ring carbon atoms; $X^{001}$ to $X^{003}$ are independently a substituted or unsubstituted aromatic group having 6 to 50 ring carbon atoms, a substituted or unsubstituted aromatic heterocyclic group having 5 to 50 ring atoms, a substituted or unsubstituted alkyl group having 1 to 50 carbon atom, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a carboxyl group, a halogen atom, a cyano group, a nitro group or a hydroxy group. a, b and c each are an integer of 0 to 4. n is an integer of 1 to 3. When n is two or more, the groups in [ ] may be the same or different. n is preferably 1. a, b and c are preferably 0.

The fluorescent dopant of the blue emitting portion is preferably a compound represented by the following formula.

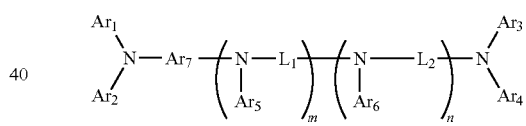

wherein $Ar_1$ to $Ar_6$ are independently an aryl group having 6 to 30 carbon atoms and $Ar_7$ is an arylene group having 6 to 30 carbon atoms. $Ar_1$ to $Ar_7$ may be substituted, and as the substituent, an alkoxy group, a dialkylamino group, an alkyl group, a fluoroalkyl group or a silyl group is preferable. m is 0 or 1, and n is 0 or 1. $L_1$ and $L_2$ are independently an alkenylene group or a divalent aromatic hydrocarbon group.

In addition to the above-mentioned hosts, dibenzofuran compounds disclosed in WO05/113531 and JP2005-314239, fluorene compounds disclosed in WO02/14244, and benzanthracene compounds disclosed in WO08/145,239 can be used.

In addition to the above-mentioned dopants, pyrene compounds disclosed in JP2004-204238, WO05/108348, WO04/83162, WO09/84512, KR10-2008-79956, KR10-2007-115588 and KR10-2010-24894, chrysene compounds disclosed in WO04/44088, and anthracene compounds disclosed in WO07/21117 can be used.

Preferably, the host is a compound which is formed by bonding of ring structures or single atoms (including bonding of a ring structure and a single atom) and the bonding is a single bond. A compound which has a double bond in the part other than the ring structure thereof is not preferable. The reason therefor is that the triplet energy generated on the host is used for the structural change of the double bond, without being used for a TTF phenomenon.

The host of the green emitting portion is preferably a compound represented by the following formula (1) or (2).

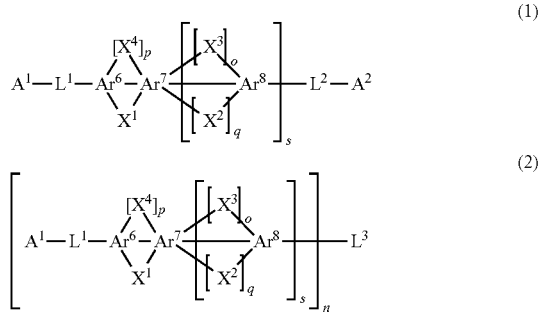

In the formulas (1) and (2), $Ar^6$, $Ar^7$ and $Ar^8$ is independently a substituted or unsubstituted aromatic hydrocarbon group having 6 to 24 ring carbon atoms or a substituted or unsubstituted aromatic heterocyclic group having 3 to 24 ring atoms. $Ar^6$, $Ar^7$ and $Ar^8$ may have one or a plurality of substituents Y, plural Ys may be the same or different, and Y is an alkyl group having 1 to 20 carbon atoms, a substituted or unsubstituted cycloalkyl group having 3 to 20 ring carbon atoms, an alkoxy group having 1 to 20 carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms which links to $Ar^6$, $Ar^7$ or $Ar^8$ via a carbon-carbon bond.

In the formulas (1) and (2), $X^1$, $X^2$, $X^3$ and $X^4$ are independently O, S, N—$R^1$ or $CR^2R^3$. o, p and q are 0 or 1, and s is 1, 2 or 3. $R^1$, $R^2$ and $R^3$ are independently an alkyl group having 1 to 20 carbon atoms, a substituted or unsubstituted cycloalkyl group having 3 to 20 ring carbon atoms, an aralkyl group having 7 to 24 carbon atoms, a silyl group having 3 to 20 carbon atoms, a substituted or unsubstituted aromatic hydrocarbon group having 6 to 24 ring carbon atoms or a substituted or unsubstituted aromatic heterocyclic group having 3 to 24 ring atoms.

In the formulas (1) and (2), $L^1$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which links to $Ar^6$ via a carbon-carbon bond.

In the formula (1), $L^2$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which links to $Ar^8$ via a carbon-carbon bond.

In the formula (2), n is 2, 3 or 4, which forms a dimmer, a trimmer or a tetramer with $L^3$ being a linkage group respectively.

In the formula (2), when n is 2, $L^3$ is a single bond, an alkylene group having 1 to 20 carbon atoms, a substituted or unsubstituted cycloalkylene group having 3 to 20 ring carbon atoms, a divalent silyl group having 2 to 20 carbon atoms, a substituted or unsubstituted divalent aromatic hydrocarbon group having 6 to 24 ring carbon atoms or a substituted or unsubstituted divalent aromatic heterocyclic group having 3 to 24 ring atoms which links to $Ar^8$ via a carbon-carbon bond. When n is 3, $L^3$ is a trivalent alkane having 1 to 20 carbon atoms, a substituted or unsubstituted trivalent cycloalkane having 3 to 20 ring carbon atoms, a trivalent silyl group having 1 to 20 carbon atoms, a substituted or unsubstituted trivalent aromatic hydrocarbon group having 6 to 24 ring carbon atoms or a substituted or unsubstituted trivalent aromatic heterocyclic group having 3 to 24 ring atoms which links to $Ar^8$ via a carbon-carbon bond. When n is 4, $L^3$ is a tetravalent alkane having 1 to 20 carbon atoms, a substituted or unsubstituted tetravalent cycloalkane having 3 to 20 ring carbon atoms, a silicon atom, a substituted or unsubstituted tetravalent aromatic hydrocarbon group having 6 to 24 ring carbon atoms or a substituted or unsubstituted tetravalent aromatic heterocyclic group having 3 to 24 ring atoms which links to $Ar^8$ via a carbon-carbon bond.

In the formulas (1) and (2), $A^1$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atoms or a substituted or unsubstituted aromatic heterocyclic ring group having 3 to 24 ring atoms which links to $L^1$ via a carbon-carbon bond.

In the formula (1), $A^2$ is a hydrogen atom, a substituted or unsubstituted cycloalkyl group having 3 to 20 ring carbon atoms, a silyl group having 3 to 20 carbon atoms, a substituted or unsubstituted aromatic hydrocarbon group having 6 to 24 ring carbon atom or a substituted or unsubstituted aromatic heterocyclic group having 3 to 24 ring atoms which links to $L^2$ via a carbon-carbon bond.

The host of the green emitting portion is preferably a compound represented by the following formula (3) or (4).

wherein Cz is a substituted or unsubstituted arylcarbazolyl group or a carbazolylalkylene group and A is a group represented by the following formula. n and m are independently an integer of 1 to 3.

wherein M and M' are independently a substituted or unsubstituted nitrogen-containing heteroaromatic ring having 2 to 40 carbon atoms and may be the same or different. L is a single bond, a substituted or unsubstituted arylene group having 6 to 30 carbon atoms, a substituted or unsubstituted cycloalkylene group having 5 to 30 carbon atoms or a substituted or unsubstituted heteroaromatic ring having 2 to 30 carbon atoms. p is an integer of 0 to 2, q is an integer of 1 to 2 and r is an integer of 0 to 2.

p+r is 1 or more.

The phosphorescent dopant of the green emitting portion preferably contains a metal complex composed of a metal selected from the group consisting of Ir, Pt, Os, Au, Cu, Re and Ru, and a ligand.

Specific examples of such dopant materials include PQIr (iridium (III) bis(2-phenyl quinolyl-N, $C^{2'}$) acetylacetonate) and $Ir(ppy)_3$ (fac-tris(2-phenylpyridine) iridium) and the following compounds.

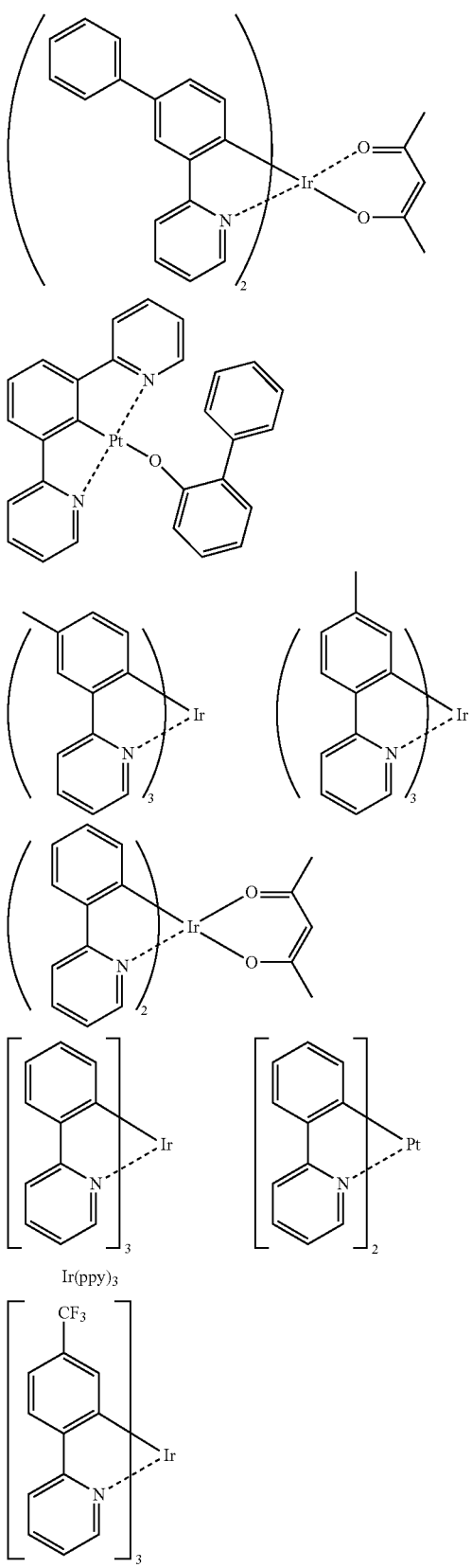

examples of the second dopant of the green emitting portion are the same as those exemplified above as the host of the green emitting portion.

As the second dopant, it is preferable to select a dopant having an affinity $Af_{gd2}$ of which the difference between the affinity $Af_{gh}$ of the host GH is 0.4 eV or less. Further, it is desirable that the energy gap of the dopant PGD be smaller than the energy gap of the second dopant GD2.

The host of the red emitting portion is, for example, at least one compound selected from polycyclic fused aromatic compounds shown by the following formulas (A), (B) and (C).

$$Ra—Ar^{101}—Rb \tag{A}$$

$$Ra—Ar^{101}—Ar^{102}—Rb \tag{B}$$

$$Ra—Ar^{101}—Ar^{102}—Ar^{103}—Rb \tag{C}$$

wherein $Ar^{101}$, $Ar^{102}$, $Ar^{103}$, Ra and Rb are independently a substituted or unsubstituted benzene ring, or a polycyclic fused aromatic skeleton part selected from a substituted or unsubstituted naphthalene ring, a substituted or unsubstituted chrysene ring, a substituted or unsubstituted fluoranthene ring, a substituted or unsubstituted phenanthrene ring, a substituted or unsubstituted benzophenanthrene ring, a substituted or unsubstituted dibenzophenanthrene ring, a substituted or unsubstituted triphenylene ring, a substituted or unsubstituted benzo[a]triphenylene ring, a substituted or unsubstituted benzochrysene ring, a substituted or unsubstituted benzo[b]fluoranthene ring, and a substituted or unsubstituted picene ring; provided that $Ar^{101}$, $Ar^{102}$, $Ar^{103}$, Ra and Rb are not a substituted or unsubstituted benzene ring at the same time.

It is preferred that one or both of the Ra and Rb be a ring selected from a substituted or unsubstituted phenanthrene ring, a substituted or unsubstituted benzo[c]phenanthrene ring and a substituted or unsubstituted fluoranthene ring.

The above-mentioned polycyclic fused aromatic compound contains the polycyclic fused aromatic skeleton part as a group of divalent or more valences in its structure.

The polycyclic fused aromatic skeleton part may have a substituent, and the substituent is a substituted or unsubstituted aryl group or a substituted or unsubstituted heteroaryl group.

In addition, the substituent of the polycyclic fused aromatic compound dose not contain a carbazole skeleton, for example.

The phosphorescent dopant of the red emitting portion desirably contains a metal complex composed of a metal selected from the group consisting of Ir, Pt, Os, Au, Cu, Re and Ru, and a ligand.

Examples thereof include the following:

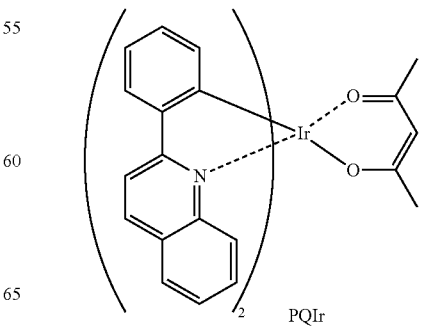

As the second dopant, a material usable as a host material of the green emitting portion can be used. Therefore, the

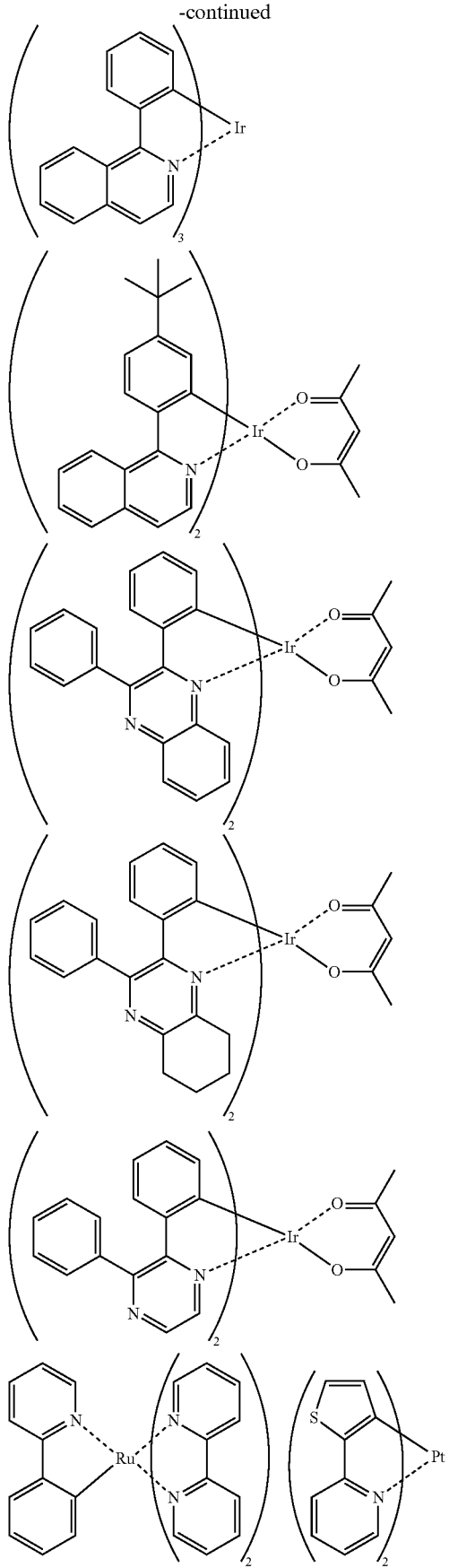
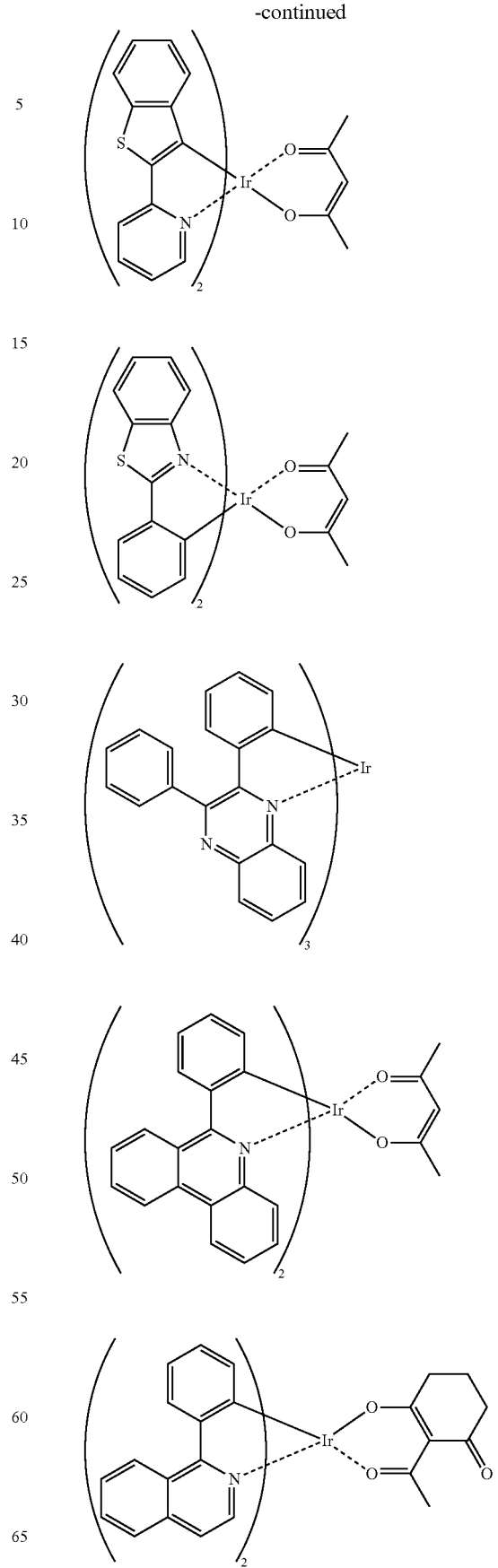

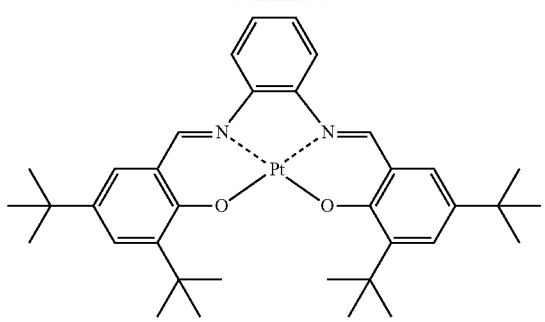
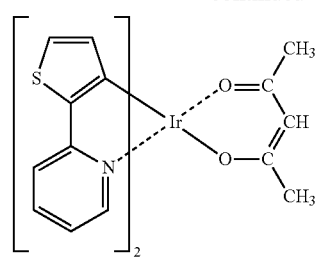
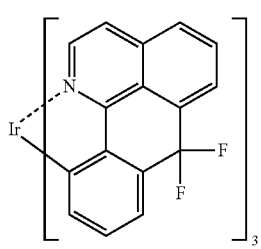
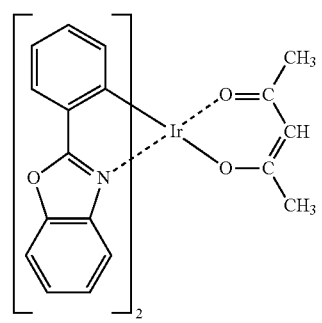
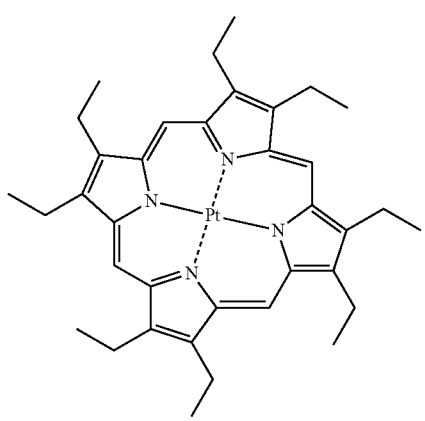
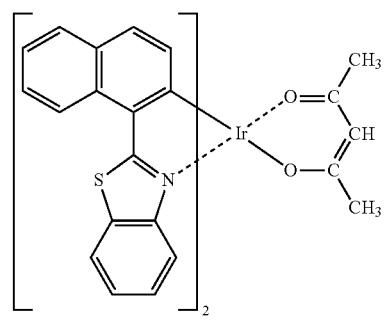
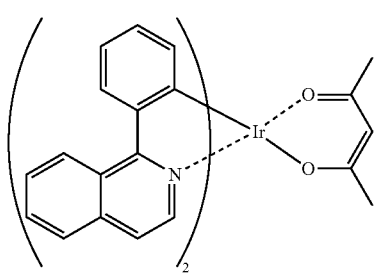
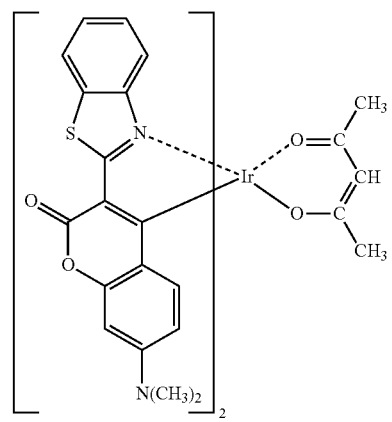
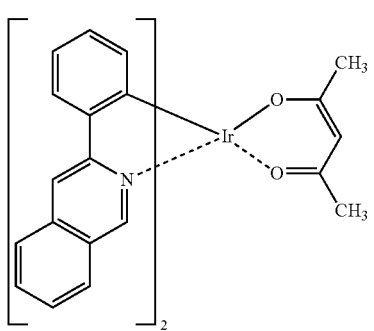
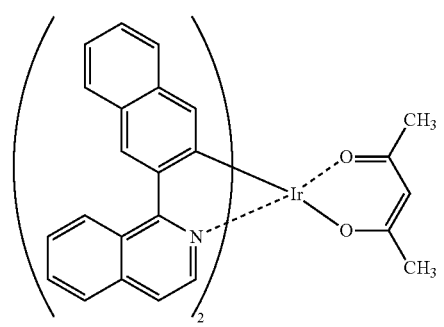

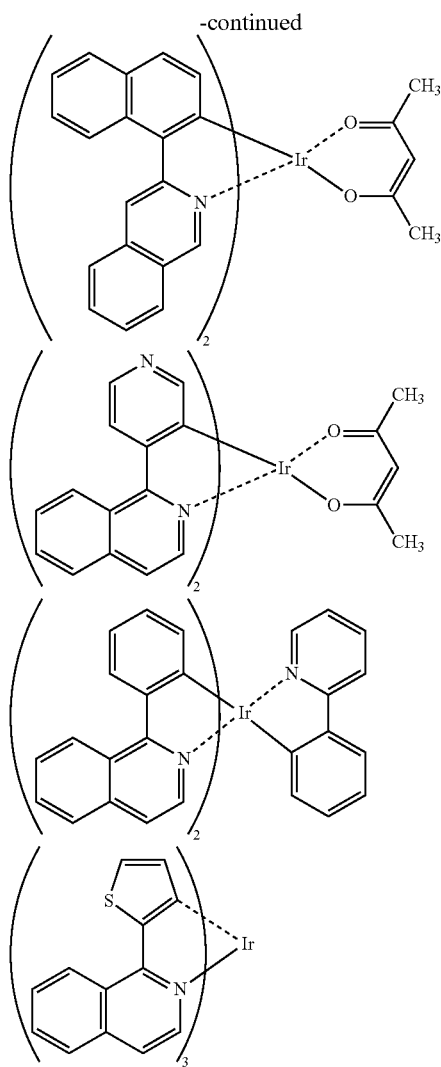

The holes which do not contribute to recombination in the emitting layer may be injected to the electron-transporting layer. Therefore, it is preferred that the material used for the electron-transporting layer be improved in resistance to oxidation.

As for the specific examples of the materials improved in resistance to oxidation, aromatic hydrocarbon compounds, in particular, polycyclic fused aromatic ring compounds are preferable. An organic complex such as BAlq is poor in resistance to oxidation since it has polarity within a molecule.

The electron-transporting region is composed of a stacked structure of one or more electron-transporting layers, or a stacked structure of one or more electron-transporting layers and one or more electron-injecting layers.

The following may be considered as the structure between the emitting layer and the cathode.

Emitting layer/Electron-transporting layer/Cathode

Emitting layer/Electron-transporting layer/Electron-injecting layer/Cathode

Emitting layer/Electron-transporting layer/Electron-transporting layer/Electron-injecting layer/Cathode The electron-transporting region is provided in such a manner that it is common to the green emitting portion, the blue emitting portion and the red emitting portion. Therefore, the triplet energy of the material constituting the electron-transporting layer adjacent to the emitting layer may be larger than the triplet energy of the host of the blue emitting portion and the difference between the affinity of the host of the green emitting portion and the affinity of the material constituting the electron-transporting layer adjacent to the emitting layer may be 0.4 eV or less.

It is preferred that the difference between the affinity of the host of the red emitting portion and the affinity of the material constituting the electron-transporting layer adjacent to the emitting layer be 0.4 eV or less.

It is preferred that the difference between the affinity of the host of the blue emitting portion and the affinity of the material constituting the electron-transporting layer adjacent to the emitting layer be 0.4 eV or less.

Further, in respect of injection properties of electrons to the emitting layer, it is preferred that the following relationship be satisfied.

−0.3 eV<(affinity of the electron-transporting layer adjacent to the emitting layer)−(affinity of the host of the green emitting portion)<0.4

It is further preferred that the following relationship be satisfied.

−0.2 eV<(affinity of the electron-transporting layer adjacent to the emitting layer)−(affinity of the host of the green emitting portion)<0.4

In respect of the above-mentioned values of the affinity and the triplet energy, as the specific examples of the material constituting the electron-transporting layer, one or more compounds selected from the group consisting of the polycyclic fused aromatic compounds shown by the formulas (10), (20) and (30) given below.

(10) A material represented by the following formula (11) or a dimer thereof represented by the following formula (12)

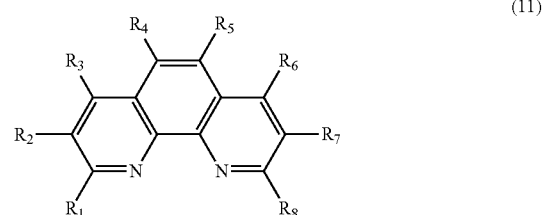

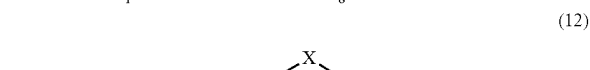

wherein $R^1$ to $R^{21}$ are a hydrogen atom, a substituted or unsubstituted alkyl group, a substituted or unsubstituted aryl group, a substituted or unsubstituted amino group, a halogen atom, a nitro group, a cyano group or a hydroxyl group. In the above formula, X is a substituted or unsubstituted alkylene group or a substituted or unsubstituted arylene group.

(20) A material represented by the following formula

wherein HAr is a substituted or unsubstituted nitrogen-containing heterocycle having 3 to 40 carbon atoms; $L^1$ is a single bond, a substituted or unsubstituted arylene group having 6 to 40 carbon atoms or a substituted or unsubstituted heteroarylene group having 3 to 40 carbon atoms; $Ar^1$ is a substituted or unsubstituted divalent aromatic hydrocarbon group having 6 to 40 carbon atoms; and $Ar^2$ is a substituted or unsubstituted aryl group having 6 to 40 carbon atoms or a substituted or unsubstituted heteroaryl group having 3 to 40 carbon atoms.

(30) Fused polycyclic aromatic compounds represented by the above formulas (A), (B) and (C)

When the compound of formula (20) is used, $Ar^1$ is preferably an anthracenylene group in view of the affinity of an emitting layer host material. When the compound of formula (10) is used, the compound of formula (12) is preferable in view of heat resistance.

As specific examples of the electron-transporting layer and the electron-injecting layer being not adjacent to the emitting layer, a metal complex of 8-hydroxyquinolinone or a derivative thereof, an oxadiazole derivative or a nitrogen-containing heterocycle derivative is preferable. Specific examples of the metal complex of 8-hydroxyquinolinone or a derivative thereof include a metal chelate oxinoid compound containing a chelate of an oxine (generally 8-quinolinol or 8-hydroxyquinone). Tris(8-quinolinol)aluminum can be used, for example.

Examples of the nitrogen-containing heterocycle derivative include a compound represented by the above formula (20).

It is preferred that the material for the electron-transporting layer have an electron mobility of $10^{-6}$ cm$^2$/Vs or more in an electric field intensity of 0.04 to 0.5 MV/cm. An electron mobility of $10^{-4}$ cm$^2$/Vs or more is further desirable.

As the method for measuring the electron mobility of an organic material, several methods including the Time of Flight method are known. In the invention, however, the electron mobility is determined by the impedance spectroscopy.

An explanation is made on the measurement of the mobility by the impedance spectroscopy. An electron-transporting layer material with a thickness of preferably about 100 nm to 200 nm is held between the anode and the cathode. While applying a bias DC voltage, a small alternate voltage of 100 mV or less is applied, and the value of an alternate current (the absolute value and the phase) which flows at this time is measured. This measurement is performed while changing the frequency of the alternate voltage, and complex impedance (Z) is calculated from a current value and a voltage value. Dependency of the imaginary part (ImM) of the modulus M=iωZ (i: imaginary unit ω: angular frequency) on the frequency is obtained. The inverse of a frequency at which the 1 mM becomes the maximum is defined as the response time of electrons carried in the electron-transporting layer. The electron mobility is calculated according to the following formula:

Electron mobility=(film thickness of the material for forming the electron-transporting layer)$^2$/(response time·voltage)

Specific examples of a material of which the electron mobility is $10^{-6}$ cm$^2$/Vs or more in an electric field intensity of 0.04 to 0.5 MV/cm include a material having a fluoranthene derivative in the skeleton part of a polycyclic aromatic compound.

As the electron-transporting region, a stacked structure of the above-mentioned electron-transporting material and an alkali metal compound or a material obtained by adding a donor represented by an alkali metal or the like to a material constituting the electron-transporting material may be used.

As the alkaline metal compound, a halide or an oxide of an alkali metal can be given as a preferable example. A fluoride of an alkali metal is further preferable. For example, LiF can be given as a preferable example.

It is preferred that the relationship shown by the affinity Ae of the electron-injecting layer—the affinity Ab of the electron transporting layer <0.2 eV be satisfied. If this relationship is not satisfied, injection of electrons from the electron-injecting layer to the electron-transporting layer is deteriorated. As a result, an increase in driving voltage may occur due to the accumulation of electrons within the electron-transporting region, and energy quenching may occur due to collision of the accumulated electrons and triplet excitons.

When the electron-transporting region is composed of one electron transporting layer, the electron transporting layer is preferably formed of a blocking material having an electron transporting structural part and a triplet blocking structural part composed of a polycyclic fused aromatic hydrocarbon compound. The structural part is an individual ring structure contained in a compound, which is a single ring or fused ring from which a substituent is removed.

The triplet blocking structural part means a structural part which has the lowest (smallest) triplet energy in the structural parts contained in a compound. That is, the triplet energy of the compound is substantially determined as that of the triplet blocking structural part. A plurality of triplet blocking structural parts may be contained. The triplet energy of the triplet blocking structural part means the triplet energy of an independent ring structure from which a substituent is removed and which is substituted by a hydrogen atom at a bonding position to another structural part.

As for the members used in the invention, such as the substrate, the anode, the cathode, the hole-injecting layer, the hole-transporting layer or the like, known members stated in PCT/JP2009/053247, PCT/JP2008/073180, U.S. patent application Ser. No. 12/376,236, U.S. patent application Ser. No. 11/766,281, U.S. patent application Ser. No. 12/280,364 or the like can be appropriately selected and used.

It is preferred that the hole-transporting layer include an aromatic amine derivative represented by any of the following formulas (1) to (5).

(1)

(2)

(3)

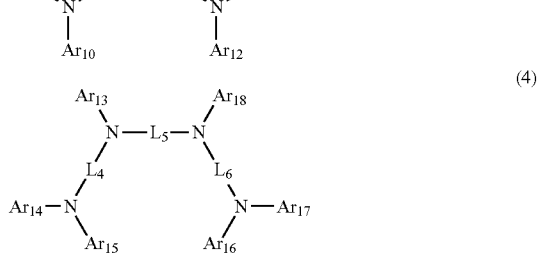

(4)

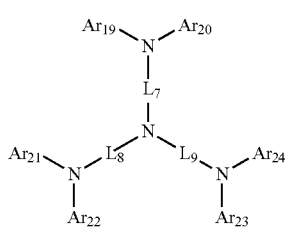

(5)

wherein Ar¹ to Ar²⁴ are independently a substituted or unsubstituted aryl group having 6 to 50 ring carbon atoms or a substituted or unsubstituted heteroaryl group having 5 to 50 ring atoms; and $L^1$ to $L^9$ are independently a substituted or unsubstituted arylene group having 6 to 50 ring carbon atoms or a substituted or unsubstituted heteroarylene group having 5 to 50 ring atoms.

Examples of a substituent which Ar¹ to Ar²⁴ and $L^1$ to $L^9$ may have include a linear or branched alkyl group having 1 to 15 carbon atoms, a cycloalkyl group having 3 to 15 ring carbon atoms, a trialkylsilyl group having a linear or branched alkyl group having 1 to 15 carbon atoms, a triarylsilyl group having an aryl group having 6 to 14 ring carbon atoms, an alkylarylsilyl group having a linear or branched alkyl group having 1 to 15 carbon atoms and an aryl group having 6 to 14 ring carbon atoms, an aryl group having 6 to 50 ring carbon atoms, a heteroaryl group having 5 to 50 ring atoms, a halogen atom, and a cyano group. Adjacent substituents may bond to each other to form a saturated or unsaturated divalent group forming a ring.

At least one of the aforementioned Ar¹ to Ar²⁴ is preferably a substituent represented by the following formula (6) or (7).

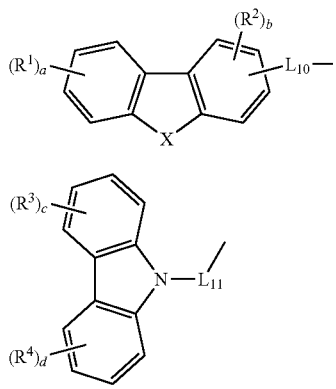

wherein x is an oxygen atom, sulfur atom or N—Ra wherein Ra is a linear or branched alkyl group having 1 to 15 carbon atoms, a cycloalkyl group having 3 to 15 ring carbon atoms, an aryl group having 6 to 50 ring carbon atoms or a heteroaryl group having 5 to 50 ring atoms;

$L^{10}$ is a single bond, a substituted or unsubstituted arylene group having 6 to 50 ring carbon atoms or a substituted or unsubstituted heteroarylene group having 5 to 50 ring atoms;

$L^{11}$ is a substituted or unsubstituted arylene group having 6 to 50 ring carbon atoms or a substituted or unsubstituted heteroarylene group having 5 to 50 ring atoms;

R¹ to R⁴ are independently a linear or branched alkyl group having 1 to 15 carbon atoms, a cycloalkyl group having 3 to 15 ring carbon atoms, a trialkylsilyl group having a linear or branched alkyl group having 1 to 15 carbon atoms, a triarylsilyl group having an aryl group having 6 to 14 ring carbon atoms, an alkylarylsilyl group having a linear or branched alkyl group having 1 to 15 carbon atoms and an aryl group having 6 to 14 ring carbon atoms, an aryl group having 6 to 14 ring carbon atoms, a heteroaryl group having 5 to 50 ring atoms, a halogen atom, or a cyano group. Adjacent groups of R¹s to R⁴s may bond to each other to form a ring;

a, c, and d are an integer of 0 to 4; and b is an integer of 0 to 3.

The compound represented by the formula (1) is preferably the compound represented by the following formula (8).

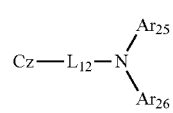

(8)

wherein Cz is a substituted or unsubstituted carbazolyl group;

$L_{12}$ is a substituted or unsubstituted arylene group having 6 to 50 ring carbon atoms or a substituted or unsubstituted heteroarylene group having 5 to 50 ring atoms; and $Ar_{25}$ and $Ar_{26}$ are independently a substituted or unsubstituted aryl group having 6 to 50 ring carbon atoms or a substituted or unsubstituted heteroaryl group having 5 to 50 ring atoms.

The compound represented by the formula (8) is preferably the compound represented by the following formula (9).

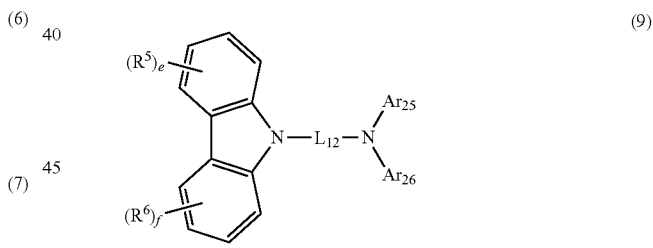

(9)

wherein R⁵ and R⁶ are independently a linear or branched alkyl group having 1 to 15 carbon atoms, a cycloalkyl group having 3 to 15 ring carbon atoms, a trialkylsilyl group having a linear or branched alkyl group having 1 to 15 carbon atoms, a triarylsilyl group having an aryl group having 6 to 14 ring carbon atoms, an alkylarylsilyl group having a linear or branched alkyl group having 1 to 15 carbon atoms or an aryl group having 6 to 14 ring carbon atoms, an aryl group having 6 to 14 ring carbon atoms, a heteroaryl group having 5 to 50 ring atoms, a halogen atom, or a cyano group; adjacent groups of R⁵s and R⁶s may bond to each other to form a ring;

e and f are an integer of 0 to 4; and $L_{12}$, $Ar_{25}$ and $Ar_{26}$ are the same as $L_{12}$, $Ar_{25}$ and $Ar_{26}$ in the formula (8).

The compound represented by the formula (9) is preferably the compound represented by the following formula (10).

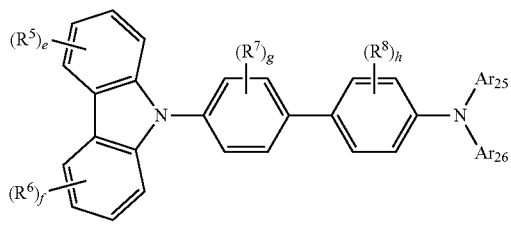

(10)

wherein $R^7$ and $R^6$ are independently a linear or branched alkyl group having 1 to 15 carbon atoms, a cycloalkyl group having 3 to 15 ring carbon atoms, a trialkylsilyl group having a linear or branched alkyl group having 1 to 15 carbon atoms, a triarylsilyl group having an aryl group having 6 to 14 ring carbon atoms, an alkylarylsilyl group having a linear or branched alkyl group having 1 to 15 carbon atoms and an aryl group having 6 to 14 ring carbon atoms, an aryl group having 6 to 14 ring carbon atoms, a heteroaryl group having 5 to 50 ring atoms, a halogen atom, or a cyano group; adjacent groups of $R^5$s and $R^6$s may bond to each other to form a ring;

g and h are an integer of 0 to 4; and $R^5$, $R^6$, e, f, $Ar_{25}$ and $Ar_{26}$ are the same as $R^5$, $R^6$, e, f, $Ar_{25}$ and $Ar_{26}$ in the formula (9).

EXAMPLES

Materials used in Examples and Comparative Examples and the properties thereof are shown below.

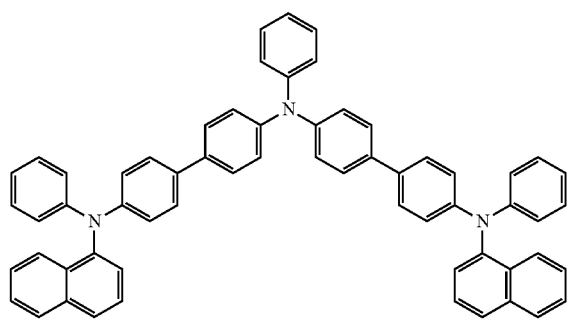

HT
$E^T = 2.4$ eV

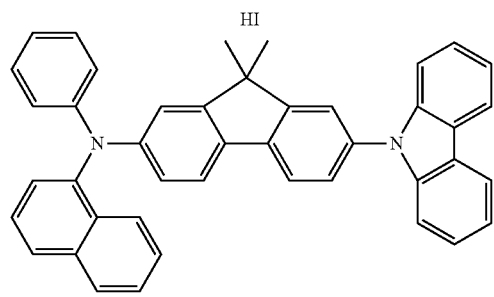

HI

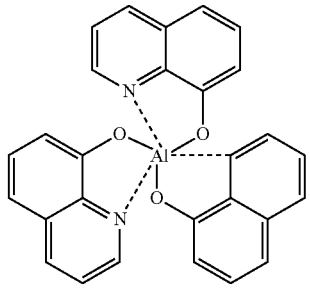

Alq3
$E^T = 2.0$ eV
Affinity = 3.0 eV

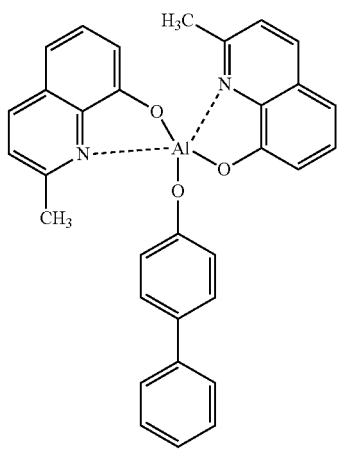

BAlq
$E^T = 2.4$ eV
Affinity = 3.0 eV

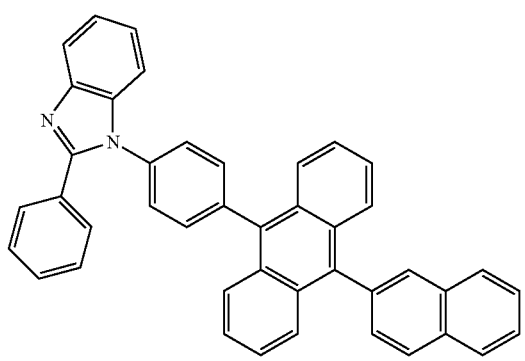

EI1
$E^T = 1.82$ eV
Afinity = 3.1 eV

-continued
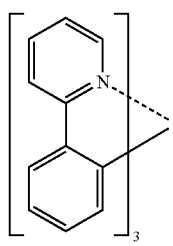
Ir(ppy)3
$E^T$ = 2.45 eV
Ionization potential = 5.2 eV
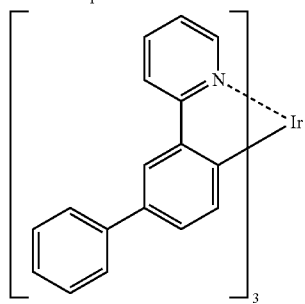
Ir(Ph-ppy)3
$E^T$ = 2.4 eV
Ionization potential = 5.3 eV
-continued
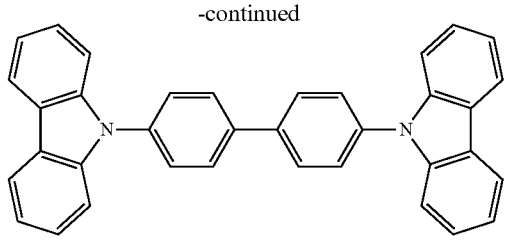
CBP
$E^T$ = 2.6 eV
Affinity = 2.4 eV
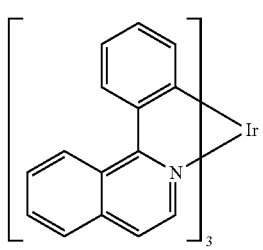
Ir(piq)3
$E^T$ = 1.8 eV
Ionization potential = 5.2 eV
|  | $E^T$(eV) | Affinity (eV) |
|---|---|---|
| RH_1 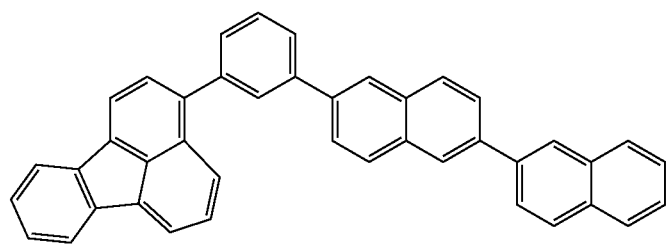 [SMILES: c1cc(-c2ccc3cc(-c4ccc5ccccc5c4)ccc3c2)cc(-c2ccc3c4c(cccc24)-c2ccccc2-3)c1] | 2.3 | 3.0 |
| RH_2 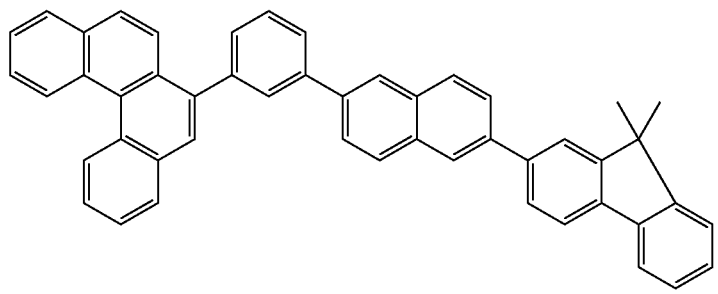 [SMILES: CC1(C)c2ccccc2-c2ccc(-c3ccc4cc(-c5cccc(-c6cc7ccccc7c7c6ccc6ccccc67)c5)ccc4c3)cc21] | 2.3 | 2.7 |

-continued

| | $E^T$(eV) | Affinity (eV) |
|---|---|---|
| RH_3 | 2.4 | 2.7 |
| RH_4 | 2.4 | 2.7 |
| RH_5 | 2.4 | 2.8 |
| RH_6 | 2.4 | 2.7 |

-continued
| | | $E^T$(eV) | Affinity (eV) |
|---|---|---|---|
| RH_7 | 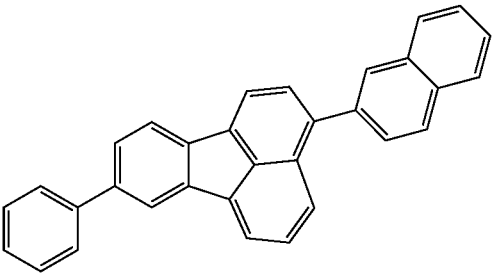 [SMILES: c1ccc(-c2ccc3c(c2)-c2cccc4c(-c5ccc6ccccc6c5)ccc-3c24)cc1] | 2.3 | 2.7 |
| RH_8 | 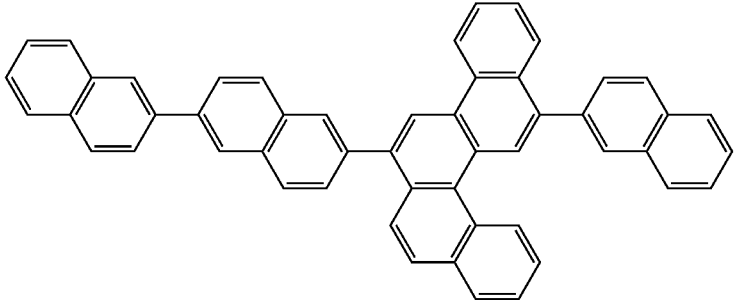 [SMILES: c1ccc2cc(-c3ccc4cc(-c5cc6c7ccccc7c(-c7ccc8ccccc8c7)cc6c6c5ccc5ccccc56)ccc4c3)ccc2c1] | 2.4 | 2.8 |
| RH_9 | 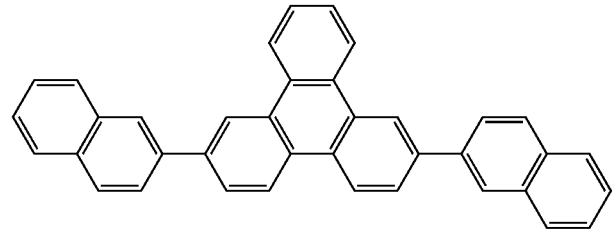 [SMILES: c1ccc2cc(-c3ccc4c5ccc(-c6ccc7ccccc7c6)cc5c5ccccc5c4c3)ccc2c1] | 2.4 | 2.7 |
| GH_1 | 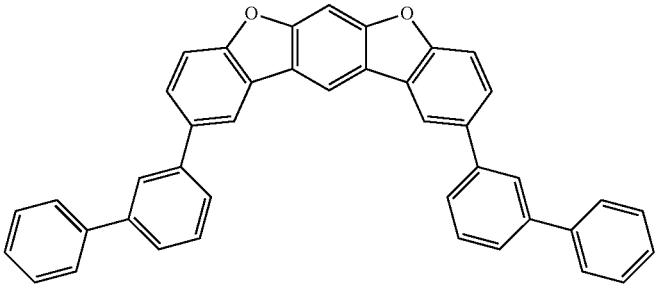 [SMILES: c1ccc(-c2cccc(-c3ccc4oc5cc6oc7ccc(-c8cccc(-c9ccccc9)c8)cc7c6cc5c4c3)c2)cc1] | 3.0 | 2.5 |
| GH_2 | 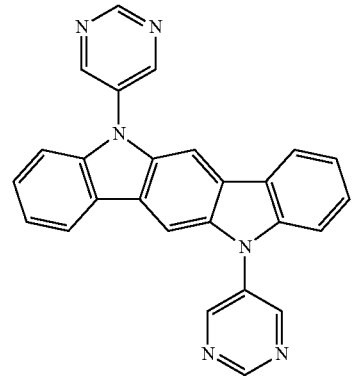 [SMILES: c1ccc2c(c1)c1cc3c(cc1n2-c1cncnc1)c1ccccc1n3-c1cncnc1] | 2.8 | 2.7 |

-continued

| | $E^T$(eV) | Affinity (eV) |
|---|---|---|
| GH_3 | 2.8 | 2.9 |
| GH_4 | 2.8 | 2.5 |
| GH_5 | 2.8 | 2.7 |
| GH_6 | 2.8 | 2.8 |

-continued

| | $E^T$(eV) | Affinity (eV) |
|---|---|---|
| GH_7 | 2.8 | 2.5 |
| GH_8 | 2.8 | 2.5 |
| GH_9 | 2.8 | 2.5 |
| GH_10 | 2.9 | 2.6 |

-continued
| | | $E^T$(eV) | Affinity (eV) |
|---|---|---|---|
| ET_1 | 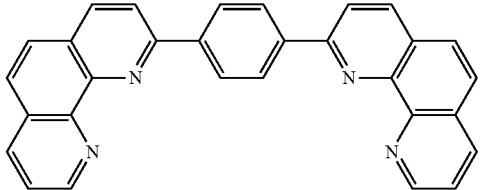 [SMILES: c1cnc2c(c1)ccc1ccc(-c3ccc(-c4ccc5ccc6cccnc6c5n4)cc3)nc12] | 2.7 | 2.9 |
| ET_2 | 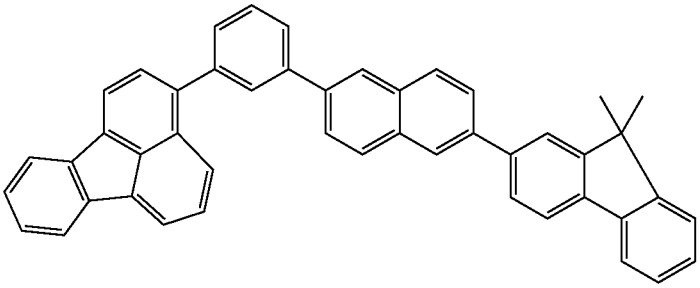 [SMILES: CC1(C)c2ccccc2-c2ccc(-c3ccc4cc(-c5cccc(-c6ccc7c8c(cccc68)-c6ccccc6-7)c5)ccc4c3)cc21] | 2.3 | 2.9 |
| ET_3 | 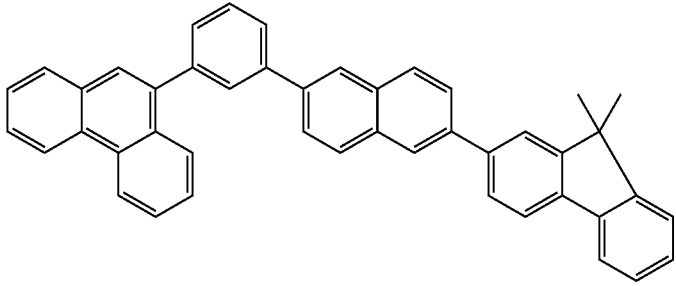 [SMILES: CC1(C)c2ccccc2-c2ccc(-c3ccc4cc(-c5cccc(-c6cc7ccccc7c7ccccc67)c5)ccc4c3)cc21] | 2.4 | 2.8 |
| ET_4 | 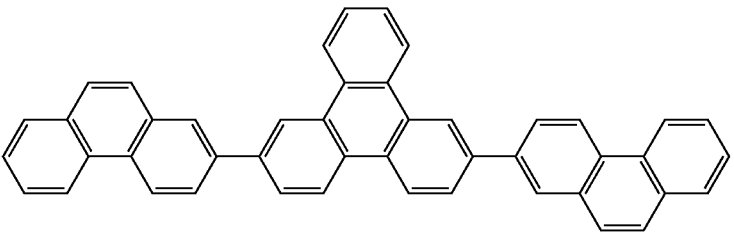 [SMILES: c1ccc2c(c1)ccc1cc(-c3ccc4c5ccc(-c6ccc7c(ccc8ccccc87)c6)cc5c5ccccc5c4c3)ccc12] | 2.4 | 2.8 |
| ET_5 | 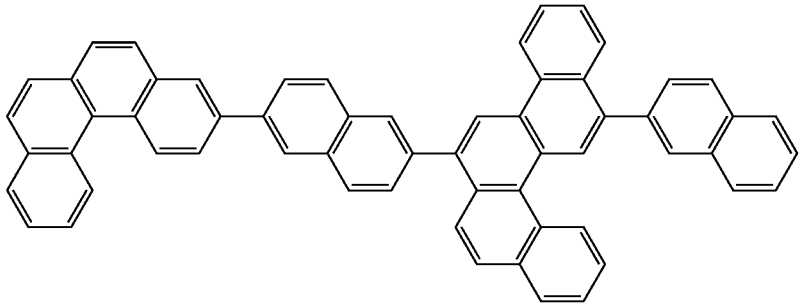 [SMILES: c1ccc2cc(-c3cc4c(cc(-c5ccc6cc(-c7ccc8c(ccc9ccc%10ccccc%10c98)c7)ccc6c5)c5ccc6ccccc6c54)c4ccccc34)ccc2c1] | 2.4 | 2.8 |
| BH_1 | 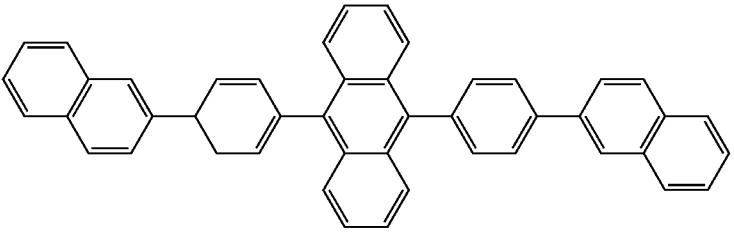 [SMILES: C1=CC(c2ccc3ccccc3c2)CC=C1c1c2ccccc2c(-c2ccc(-c3ccc4ccccc4c3)cc2)c2ccccc12] | 1.8 | 3.0 |

-continued

| | $E^T$(eV) | Affinity (eV) |
|---|---|---|
| BH_2 | 1.8 | 3.0 |
| BH_3 | 1.8 | 3.0 |
| BH_4 | 1.8 | 3.0 |
| BH_5 | 1.8 | 3.0 |

| | | $E^T$(eV) | Affinity (eV) |
|---|---|---|---|
| BD_1 | [structure] | 2.1 | 3.1 |
| BD_2 | [structure] | 2.3 | 2.7 |
| BD_3 | [structure] | 2.0 | 2.7 |

Measuring methods of the properties are shown below.

(1) Triplet Energy ($E^T$)

A commercially available device "F-4500" (manufactured by Hitachi, Ltd.) was used for the measurement. The $E^T$ conversion expression is the following.

$$E^T(eV) = 1239.85/\lambda_{edge}$$

When the phosphorescence spectrum is expressed in coordinates of which the vertical axis indicates the phosphorescence intensity and of which the horizontal axis indicates the wavelength, and a tangent is drawn to the rise of the phosphorescence spectrum on the shorter wavelength side, "$\lambda_{edge}$" is the wavelength at the intersection of the tangent and the horizontal axis. The unit for "$\lambda_{edge}$" is nm.

(2) Ionization Potential

A photoelectron spectroscopy in air (AC-1, manufactured by Riken Keiki Co., Ltd.) was used for the measurement. Specifically, light was irradiated to a material and the amount of electrons generated by charge separation was measured.

(3) Affinity

An affinity was calculated by subtracting a measured value of an energy gap from that of an ionization potential. The Energy gap was measured based on an absorption edge of an absorption spectrum in benzene. Specifically, an absorption spectrum was measured with a commercially available ultraviolet-visible spectrophotometer. The energy gap was calculated from the wavelength at which the spectrum began to raise.

Example 1

The following materials for forming layers were sequentially deposited on a substrate on which a 130 nm thick ITO film to obtain an organic EL device.

Anode: ITO (film thickness; 130 nm)
Hole-injecting layer: HI (film thickness; 50 nm)
Hole-transporting layer: HT (film thickness; 45 nm)
Emitting layer: (film thickness; blue 25 nm, green 50 nm, red 40 nm)
Blue emitting portion BH_1: BD_1 (5 wt %)
Green emitting portion GH_1: Ir(Ph-ppy)3 (10 wt %)
Red emitting portion RH_1: Ir(piq)3 (10 wt %)
Electron-transporting layer (ETL): ET1 (film thickness; 5 nm)
LiF: (film thickness 1 nm)
Cathode: Al (film thickness: 80 nm)

The blue emitting portion, green emitting portion and red emitting portion of the device obtained were caused to emit light by applying a DC of 1 mA/cm² and the luminous efficiency thereof was measured (unit: cd/A). A continuous current test of DC was conducted at the following initial luminance to measure the half life (unit: hour).

Blue: 5,000 cd/m$^2$, green: 20,000 cd/m$^2$, red: 10,000 cd/m$^2$
The results are shown in Table 1.

Examples 2 to 5, and Comparative Example 1

A device was obtained and evaluated in the same manner as in Example 1, except that the hosts and dopants of the blue emitting portion, red emitting portion and green emitting portion and the electron-transporting layer shown in Table 1 were used. The results are shown in Table 1.

As shown in Table 1, a second dopant was added to the green emitting portion in Example 5. The concentrations of the second dopant GH_10 and the first dopant Ir(ppy)3 were 20 wt % and 10 wt %, respectively.

Example 6

The following materials for forming layers were sequentially deposited on a substrate on which a 130 nm thick ITO film to obtain an organic EL device.

The organic EL device obtained was evaluated in the same manner as in Example 1. The results are shown in Table 1.

Anode: ITO (film thickness; 130 nm)
Hole-injecting layer: HI (film thickness; 50 nm)
Hole-transporting layer: HT (film thickness; 45 nm)
Emitting layer: (film thickness; blue 25 nm, green 50 nm, red 40 nm)
Blue emitting portion BH_2: BD_2 (5 wt %)
Green emitting portion GH_1: Ir(ppy)3 (10 wt %)
Red emitting portion RH_1: Ir(piq)3 (10 wt %)
Electron-transporting layer (ETL): ET2 (film thickness; 5 nm)
Electron-injecting layer (EIL): EI1 (film thickness; 20 nm)
LiF: (film thickness 1 nm)
Cathode: Al (film thickness: 80 nm)

Examples 7 to 27, and Comparative Example 2

An organic EL device was obtained and evaluated in the same manner as in Example 6, except that the hosts and dopants of the blue emitting portion, red emitting portion and green emitting portion, the electron-transporting layer and the electron-injecting layer shown in Table 1 were used. The results are shown in Table 1.

As shown in Table 1, second dopants were added to the green emitting portions in Examples 10, 15, 16, 21, 22 and 27. The concentrations of the second dopant and the first dopant were 20 wt % and 10 wt %, respectively.

TABLE 1

| | Emitting layer host | Emitting layer dopant | Electron-transporting region | Efficiency | Life |
|---|---|---|---|---|---|
| Example 1 | BH_1 | BD_1 | ET1 | 7.92 | 1000 |
| | RH_1 | Ir(piq)3 | ET1 | 10.3 | 2000 |
| | GH_1 | Ir(Ph-ppy)3 | ET1 | 57.9 | 700 |
| Example 2 | BH_1 | BD_2 | ET1 | 8.5 | 800 |
| | RH_5 | Ir(piq)3 | ET1 | 10.9 | 1900 |
| | GH_5 | Ir(Ph-ppy)3 | ET1 | 50.3 | 400 |
| Example 3 | BH_1 | BD_1 | ET1 | 7.92 | 1000 |
| | RH_1 | Ir(piq)3 | ET1 | 10.3 | 2000 |
| | GH_1 | Ir(ppy)3 | ET1 | 48.4 | 300 |
| Example 4 | BH_1 | BD_2 | ET1 | 8.5 | 800 |
| | RH_5 | Ir(piq)3 | ET1 | 10.9 | 1900 |
| | GH_5 | Ir(ppy)3 | ET1 | 47.2 | 300 |
| Example 5 | BH_1 | BD_2 | ET1 | 8.5 | 800 |
| | RH_5 | Ir(piq)3 | ET1 | 10.9 | 1900 |
| | GH_5 | GH_10:Ir(ppy)3 | ET1 | 58.1 | 600 |
| Example 6 | BH_2 | BD_1 | ET2/EI1 | 11.04 | 2000 |
| | RH_1 | Ir(piq)3 | ET2/EI1 | 11.2 | 3000 |
| | GH_1 | Ir(ppy)3 | ET2/EI1 | 50.7 | 400 |
| Example 7 | BH_2 | BD_2 | ET2/EI1 | 11.8 | 1500 |
| | RH_6 | Ir(piq)3 | ET2/EI1 | 9.5 | 1200 |
| | GH_6 | Ir(ppy)3 | ET2/EI1 | 42.9 | 200 |
| Example 8 | BH_2 | BD_2 | ET2/EI1 | 11.8 | 1500 |
| | RH_6 | Ir(piq)3 | ET2/EI1 | 9.5 | 1200 |
| | GH_1 | Ir(Ph-ppy)3 | ET2/EI1 | 60.5 | 1000 |
| Example 9 | BH_2 | BD_2 | ET2/EI1 | 11.8 | 1500 |
| | RH_1 | Ir(piq)3 | ET2/EI1 | 11.2 | 3000 |
| | GH_6 | Ir(Ph-ppy)3 | ET2/EI1 | 50.2 | 400 |
| Example 10 | BH_2 | BD_2 | ET2/EI1 | 11.8 | 1500 |
| | RH_1 | Ir(piq)3 | ET2/EI1 | 11.2 | 3000 |
| | GH_6 | GH_10:Ir(ppy)3 | ET2/EI1 | 53.1 | 400 |
| Example 11 | BH_3 | BD_1 | ET3/EI1 | 10.3 | 1500 |
| | RH_2 | Ir(piq)3 | ET3/EI1 | 10.5 | 2200 |
| | GH_2 | Ir(ppy)3 | ET3/EI1 | 45.1 | 300 |
| Example 12 | BH_3 | BD_2 | ET3/EI1 | 9.2 | 1200 |
| | RH_7 | Ir(piq)3 | ET3/EI1 | 10.2 | 1800 |
| | GH_7 | Ir(ppy)3 | ET3/EI1 | 45.5 | 300 |
| Example 13 | BH_3 | BD_1 | ET3/EI1 | 10.3 | 1500 |
| | RH_2 | Ir(piq)3 | ET3/EI1 | 10.5 | 2200 |
| | GH_2 | Ir(Ph-ppy)3 | ET3/EI1 | 48.2 | 500 |
| Example 14 | BH_3 | BD_2 | ET3/EI1 | 9.2 | 1200 |
| | RH_7 | Ir(piq)3 | ET3/EI1 | 10.2 | 1800 |
| | GH_7 | Ir(Ph-ppy)3 | ET3/EI1 | 51.2 | 500 |
| Example 15 | BH_3 | BD_1 | ET3/EI1 | 10.3 | 1500 |
| | RH_2 | Ir(piq)3 | ET3/EI1 | 10.5 | 2200 |
| | GH_2 | GH_10:Ir(ppy)3 | ET3/EI1 | 44.1 | 400 |

TABLE 1-continued

|  | Emitting layer host | Emitting layer dopant | Electron-transporting region | Efficiency | Life |
|---|---|---|---|---|---|
| Example 16 | BH_3 | BD_2 | ET3/EI1 | 9.2 | 1200 |
|  | RH_7 | Ir(piq)3 | ET3/EI1 | 10.2 | 1800 |
|  | GH_6 | GH_1:Ir(ppy)3 | ET3/EI1 | 52.8 | 500 |
| Example 17 | BH_4 | BD_1 | ET4/EI1 | 10.8 | 1000 |
|  | RH_3 | Ir(piq)3 | ET4/EI1 | 9.8 | 3000 |
|  | GH_3 | Ir(ppy)3 | ET4/EI1 | 42.1 | 200 |
| Example 18 | BH_4 | BD_3 | ET4/EI1 | 9.1 | 1000 |
|  | RH_8 | Ir(piq)3 | ET4/EI1 | 10.5 | 1900 |
|  | GH_8 | Ir(ppy)3 | ET4/EI1 | 42.3 | 500 |
| Example 19 | BH_4 | BD_1 | ET4/EI1 | 10.8 | 1000 |
|  | RH_3 | Ir(piq)3 | ET4/EI1 | 9.8 | 3000 |
|  | GH_3 | Ir(Ph-ppy)3 | ET4/EI1 | 50.1 | 500 |
| Example 20 | BH_4 | BD_3 | ET4/EI1 | 9.1 | 1000 |
|  | RH_8 | Ir(piq)3 | ET4/EI1 | 10.5 | 1900 |
|  | GH_8 | Ir(Ph-ppy)3 | ET4/EI1 | 48.8 | 600 |
| Example 21 | BH_4 | BD_3 | ET4/EI1 | 9.1 | 1000 |
|  | RH_8 | Ir(piq)3 | ET4/EI1 | 10.5 | 1900 |
|  | GH_3 | GH_10:Ir(ppy)3 | ET4/EI1 | 63.1 | 800 |
| Example 22 | BH_4 | BD_1 | ET4/EI1 | 10.8 | 1000 |
|  | RH_3 | Ir(piq)3 | ET4/EI1 | 9.8 | 3000 |
|  | GH_6 | GH_4:Ir(ppy)3 | ET4/EI1 | 53.9 | 500 |
| Example 23 | BH_5 | BD_1 | ET5/EI1 | 10.2 | 1200 |
|  | RH_4 | Ir(piq)3 | ET5/EI1 | 10.4 | 2800 |
|  | GH_4 | Ir(ppy)3 | ET5/EI1 | 46.4 | 200 |
| Example 24 | BH_5 | BD_3 | ET5/EI1 | 9.4 | 1100 |
|  | RH_9 | Ir(piq)3 | ET5/EI1 | 10.1 | 2200 |
|  | GH_9 | Ir(ppy)3 | ET5/EI1 | 48.1 | 300 |
| Example 25 | BH_5 | BD_1 | ET5/EI1 | 10.2 | 1200 |
|  | RH_4 | Ir(piq)3 | ET5/EI1 | 10.4 | 2800 |
|  | GH_4 | Ir(Ph-ppy)3 | ET5/EI1 | 49.8 | 400 |
| Example 26 | BH_5 | BD_3 | ET5/EI1 | 9.4 | 1100 |
|  | RH_9 | Ir(piq)3 | ET5/EI1 | 10.1 | 2200 |
|  | GH_9 | Ir(Ph-ppy)3 | ET5/EI1 | 49.7 | 400 |
| Example 27 | BH_5 | BD_1 | ET5/EI1 | 10.2 | 1200 |
|  | RH_4 | Ir(piq)3 | ET5/EI1 | 10.4 | 2800 |
|  | GH_6 | PGH_8:Ir(ppy)3 | ET5/EI1 | 58.8 | 400 |
| Com. Ex. 1 | BH_1 | BD_1 | Alq3 | 4.6 | 600 |
|  | CBP | Ir(piq)3 | Alq3 | 4.2 | 300 |
|  | CBP | Ir(ppy)3 | Alq3 | 15.1 | 3 |
| Com. Ex. 2 | BH_1 | BD_1 | BAlq/Alq3 | 4.3 | 500 |
|  | CBP | Ir(piq)3 | BAlq/Alq3 | 8.5 | 1000 |
|  | CBP | Ir(ppy)3 | BAlq/Alq3 | 40.3 | 50 |

INDUSTRIAL APPLICABILITY

The organic EL device of the invention can be used in display panels for large-sized TVs, illumination panels or the like.

Although only some exemplary embodiments and/or examples of this invention have been described in detail above, those skilled in the art will readily appreciated that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. An organic electroluminescence device, comprising in sequential order:
an anode;
a hole-transporting region,
an emitting layer
an electron-transporting region
and a cathode in opposition to the anode,
wherein
the emitting layer comprises a red emitting portion, a green emitting portion, and a blue emitting portion;
the blue emitting portion comprises a host BH and a fluorescent dopant FBD;
a triplet energy $E^T_{fbd}$ of the fluorescent dopant FBD is larger than a triplet energy $E^T_{bh}$ of the host BH;
the green emitting portion comprises a host GH and a phosphorescent dopant PGD;
the electron-transporting region comprises a common electron-transporting layer adjacent to the red emitting portion, the green emitting portion and the blue emitting portion;
the common electron-transporting layer comprises a material having a triplet energy $E^T_{el}$ larger than the $E^T_{bh}$; and
a difference between an affinity of the host GH and an affinity of the material constituting the common electron-transporting layer is 0.4 eV or less.

2. The organic electroluminescence device according to claim 1, wherein the red emitting portion comprises:
a host RH and a phosphorescent dopant PRD; and
a difference between an affinity of the host RH and an affinity of the material constituting the common electron-transporting layer is 0.4 eV or less.

3. The organic electroluminescence device according to claim 1, wherein a difference between the affinity of the host BH and the affinity of the material constituting the common electron-transporting layer is 0.4 eV or less.

4. The organic electroluminescence device according to claim 1, wherein an electron mobility of the material constituting the common electron-transporting layer is $10^{-6}$ cm$^2$/Vs or more in an electric field intensity of 0.04 to 0.5 MV/cm.

5. The organic electroluminescence device according to claim 1, further comprising an electron-injecting layer between the common electron-transporting layer and the cathode in the electron-transporting region.

6. The organic electroluminescence device according to claim 1, wherein an affinity $Af_{gh}$ of the host GH is 2.6 eV or more.

7. The organic electroluminescence device according to claim 1, wherein an ionization potential $Ip_{gd}$ of the dopant GD is 5.2 eV or more.

8. The organic electroluminescence device according to claim 1, wherein at least one of the blue emitting portion, the green emitting portion and the red emitting portion comprises a second dopant.

9. The organic electroluminescence device according to claim 8, wherein the green emitting portion comprises a second dopant GD2.

10. The organic electroluminescence device according to claim 9, wherein a difference between the affinity $Af_{gd2}$ of the second dopant GD2 and the affinity $Af_{gh}$ of the host GH is 0.4 eV or less.

11. The organic electroluminescence device according to claim 1, wherein the host BH is a compound which does not contain a double bond in other parts than a ring structure.

* * * * *